(12) United States Patent
Kim et al.

(10) Patent No.: US 9,281,208 B2
(45) Date of Patent: Mar. 8, 2016

(54) METHODS OF FORMING SEMICONDUCTOR DEVICES USING HARD MASK LAYERS

(71) Applicants: Sung-Min Kim, Incheon (KR); Ji-Su Kang, Seoul (KR); Dong-Kyu Lee, Hwaseong-si (KR); Dong-Ho Cha, Seongnam-si (KR)

(72) Inventors: Sung-Min Kim, Incheon (KR); Ji-Su Kang, Seoul (KR); Dong-Kyu Lee, Hwaseong-si (KR); Dong-Ho Cha, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/165,970

(22) Filed: Jan. 28, 2014

(65) Prior Publication Data

US 2014/0264572 A1 Sep. 18, 2014

(30) Foreign Application Priority Data

Mar. 15, 2013 (KR) ........................ 10-2013-0028136

(51) Int. Cl.
*H01L 21/308* (2006.01)
*H01L 29/66* (2006.01)
*H01L 29/78* (2006.01)
*H01L 21/311* (2006.01)

(52) U.S. Cl.
CPC ...... *H01L 21/3083* (2013.01); *H01L 29/66545* (2013.01); *H01L 29/66795* (2013.01); *H01L 29/785* (2013.01); *H01L 21/31144* (2013.01); *H01L 29/7848* (2013.01)

(58) Field of Classification Search
USPC ........................................ 257/331; 438/156
See application file for complete search history.

(56) References Cited

U.S. PATENT DOCUMENTS

| | | | |
|---|---|---|---|
| 6,828,212 B2 | 12/2004 | Barry et al. | |
| 7,517,811 B2 | 4/2009 | Hsieh | |
| 7,955,913 B2 | 6/2011 | Kim | |
| 2008/0308856 A1* | 12/2008 | Specht et al. | 257/316 |
| 2009/0207667 A1* | 8/2009 | Park et al. | 365/185.33 |
| 2011/0006390 A1* | 1/2011 | Huang et al. | 257/510 |
| 2011/0241098 A1* | 10/2011 | Park et al. | 257/324 |
| 2013/0187237 A1 | 7/2013 | Yu et al. | |

FOREIGN PATENT DOCUMENTS

| | | |
|---|---|---|
| JP | 2003-060022 | 2/2003 |
| KR | 1019990062237 | 7/1999 |
| KR | 1020040057527 | 7/2004 |
| KR | 1020080044455 | 5/2008 |
| KR | 1020100078761 | 7/2010 |

* cited by examiner

*Primary Examiner* — Zandra Smith
*Assistant Examiner* — Lawrence Tynes, Jr.
(74) *Attorney, Agent, or Firm* — Myers Bigel & Sibley, P.A.

(57) ABSTRACT

A method of forming a semiconductor structure can include forming a photolithography mask on a silicon fin having a hard mask layer thereon extending in a first direction. A trench can be formed through the hard mask layer into the silicon fin using the photolithography mask, where the trench extends in a second direction to separate the silicon fin into first and second fin structures extending end-to-end in the first direction. A portion of the trench formed by the hard mask layer can be widened relative to a lower portion of the trench defined by the first and second fin structures.

29 Claims, 32 Drawing Sheets

METHODS OF FORMING SEMICONDUCTOR DEVICES USING HARD MASK LAYERS

CROSS-REFERENCE TO RELATED APPLICATION

This application claims priority from Korean Patent Application No. 10-2013-0028136 filed on Mar. 15, 2013 in the Korean Intellectual Property Office, and all the benefits accruing therefrom under 35 U.S.C. 119, the contents of which in its entirety are herein incorporated by reference.

FIELD

The present inventive concept relates to a fabricating method of semiconductor device and the semiconductor device fabricated using the method.

BACKGROUND

A multi gate transistor structure has been proposed, including a fin-shaped silicon body formed on a substrate with a gate formed on a surface of the silicon body.

Since the multi gate transistor uses a three-dimensional channel, scaling may be more easily achieved. In addition, current control may be improved without increasing the gate length. Further, short channel effects (in which a potential of a channel region may be affected by a drain voltage) may be more effectively suppressed.

SUMMARY

Embodiments according to the present inventive concept can provide methods of forming semiconductor devices using hard mask layers. Pursuant to these embodiments, a method of forming a semiconductor structure can include forming a photolithography mask on a silicon fin having a hard mask layer thereon extending in a first direction. A trench can be formed through the hard mask layer into the silicon fin using the photolithography mask, where the trench extends in a second direction to separate the silicon fin into first and second fin structures extending end-to-end in the first direction. A portion of the trench formed by the hard mask layer can be widened relative to a lower portion of the trench defined by the first and second fin structures.

In some embodiments according to the inventive concept, forming a photolithography mask can be preceded by forming the silicon fin, forming a lower field insulating layer adjacent to the silicon fin, and forming the hard mask layer on the silicon fin and on the lower field insulating layer. In some embodiments according to the inventive concept, the lower field insulating layer and the hard mask layer can include respective materials having an etch selectivity relative to one another.

In some embodiments according to the inventive concept, forming a trench through the hard mask layer can include etching through the hard mask layer to expose ends of the first and second fin structures separated by the trench and widening a portion of the trench can include widening the portion of the trench above the exposed ends to expose end corners of the first and second fin structures. In some embodiments according to the inventive concept, widening a portion of the trench can include isotropic etching of the hard mask layer in the trench.

In some embodiments according to the inventive concept, isotropic etching of the hard mask layer in the trench can include recessing side walls of the hard mask layer equal amounts in opposing directions to widen the portion of the trench. In some embodiments according to the inventive concept, the method can further include depositing an upper field insulating material into the trench through the hard mask layer to cover and conform to the end corners of the first and second fin structures.

In some embodiments according to the inventive concept, the method can further include removing the hard mask layer from the first and second fin structures to expose an upper surface of the lower field insulating layer. Upper surfaces of the lower field insulating layer and of the upper field insulating material can be etched to reduce respective thicknesses thereof so that the upper field insulating material remains conforming to the end corners of the first and second fin structures. A conductive layer can be formed on the upper surface of the upper field insulating material.

In some embodiments according to the inventive concept, etching the upper surfaces can include etching equal amounts of the lower field insulating layer and the upper field insulating material so that the upper surface of the upper field insulating material remains to cover uppermost surfaces of the first and second fin structures. In some embodiments according to the inventive concept, etching the upper surfaces can include etching the lower field insulating layer and the upper field insulating material to reduce respective thicknesses thereof so that the upper surface of the upper field insulating material exposes uppermost surfaces of the first and second fin structures.

In some embodiments according to the inventive concept, a method of forming a semiconductor structure can be provided by forming a field insulating layer including a protruding portion that protrudes from a trench to conform to end corners of first and second separated fins, to form a tuck structure that overlaps the end corners of the first and second separated fin structures. A finFET can be formed on the first fin structure and a conductive layer can be formed extending from an uppermost surface of the protruding portion to cross over the protruding portion between the first and second fin structures.

In some embodiments according to the inventive concept, a semiconductor device can include first and second fin structures that are directly adjacent to one another and separated by a trench, wherein the first and second fin structures include respective first and second end corners forming an opening of the trench. A field insulating layer can include a protruding portion that protrudes from the trench to conform to the end corners of the first and second fin structures to form a tuck structure that overlaps the first and second fin structures. A finFET can be on the first fin structure and a conductive layer can extend from an uppermost surface of the protruding portion to cross over the protruding portion between the first and second fin structures. A source/drain region can be in the first fin structure.

DETAILED DESCRIPTION OF THE EMBODIMENTS ACCORDING TO THE INVENTIVE CONCEPT

Figure 1:
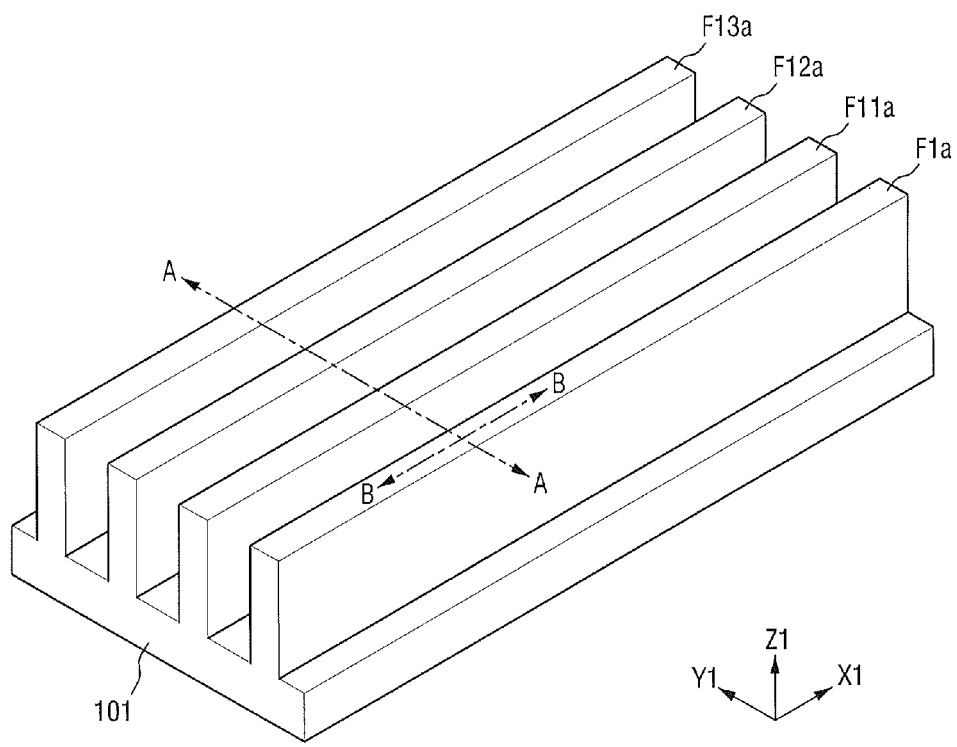
FIGS. 1, 4, 7A, 10, 12, 14, 17 and 20 are perspective views illustrating methods of forming semiconductor devices according to some embodiments of the present inventive concept.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Figure 2:
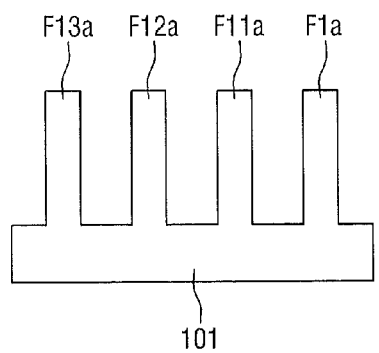
FIGS. 2, 5, 8, 15, 18 and 21 are cross-sectional views taken along lines A-A of FIGS. 1, 4, 7A, 17 and 20.
Figure 3:
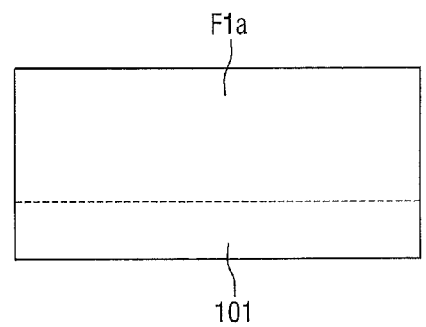
FIGS. 3, 6, 9, 11, 13, 16, 19 and 22 are cross-sectional views taken along lines B-B of FIGS. 1, 4, 7A, 10, 12, 14, 17 and 20.

Hereinafter, methods of forming semiconductor devices according to some embodiments of the present inventive concept are described with reference to FIGS. 1 to 22. As shown in FIGS. 1 to 3, a plurality of fins F1a, F11a, F12a and F13a extend in a first direction X1 and may protrude in a third direction Z1. The fins F1a, F11a, F12a and F13a may be formed by etching a substrate 101, etching an epitaxial layer grown from the substrate 101, or etching a material layer stacked using a different material from the substrate 101 (for example, a III- or V-group material). In FIGS. 1 to 3, four fins F1a, F11a, F12a and F13a are arranged abreast of each other in a lengthwise direction (X1), but aspects of the present inventive concept are not limited thereto.

Fins F1a, F11a, F12a and F13a have a rectangular parallelepiped shape, but aspects of the present inventive concept are not limited thereto. For example, the fins F1a, F11a, F12a and F13a may be chamfered. Alternatively, corners of the fins F1a, F11a, F12a and F13a may be rounded. Since the fins F1a, F11a, F12a and F13a are elongated in the first direction X1, they may have long sides formed along the first direction X1 and short sides formed along a second direction Y1. Even if the corners of the fins F1a, F11a, F12a and F13a are rounded, the long sides and short sides may be distinguished from each other.

Figure 4:
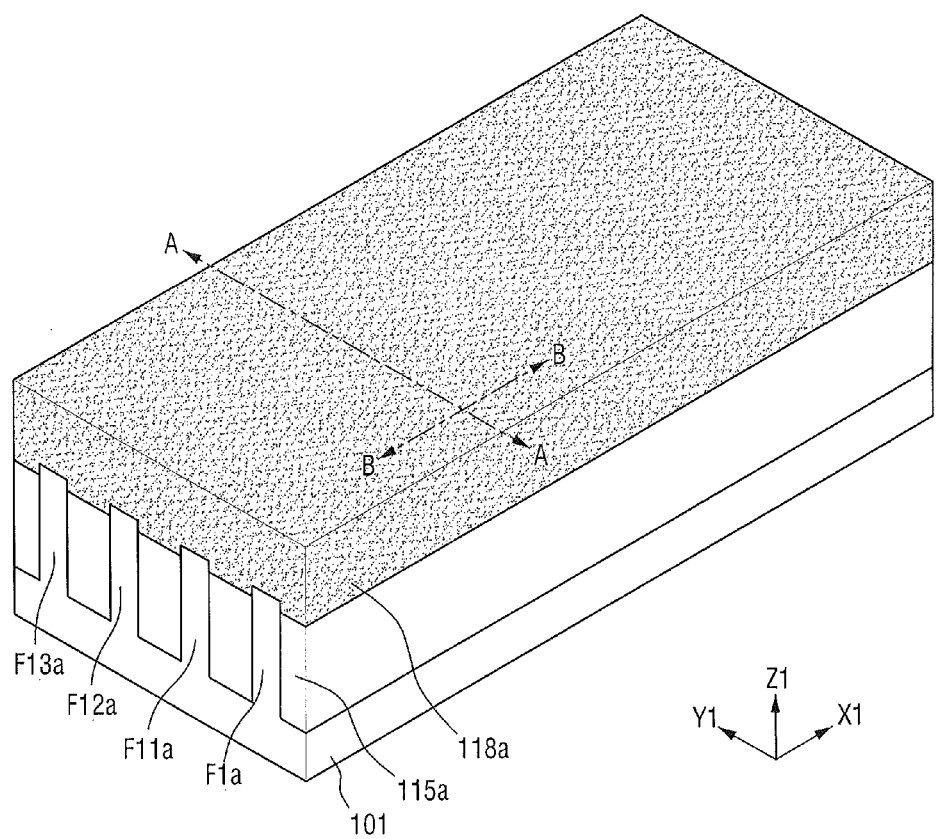
Figure 5:
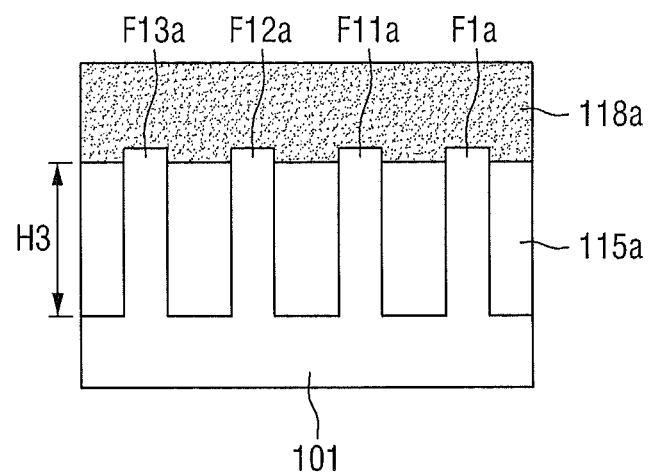
Figure 6:
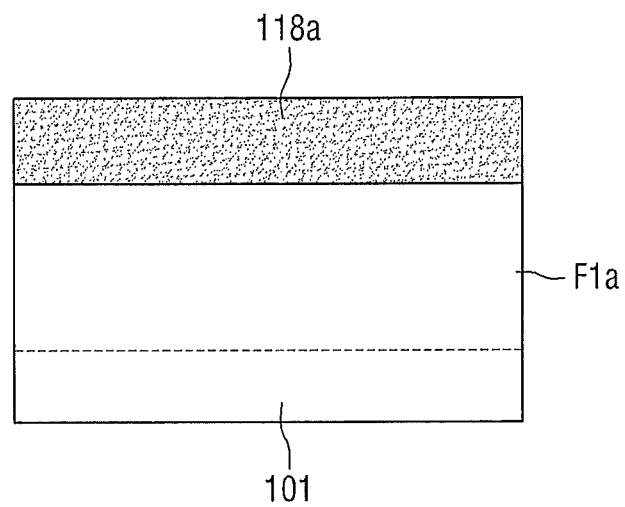
Figure 7A:
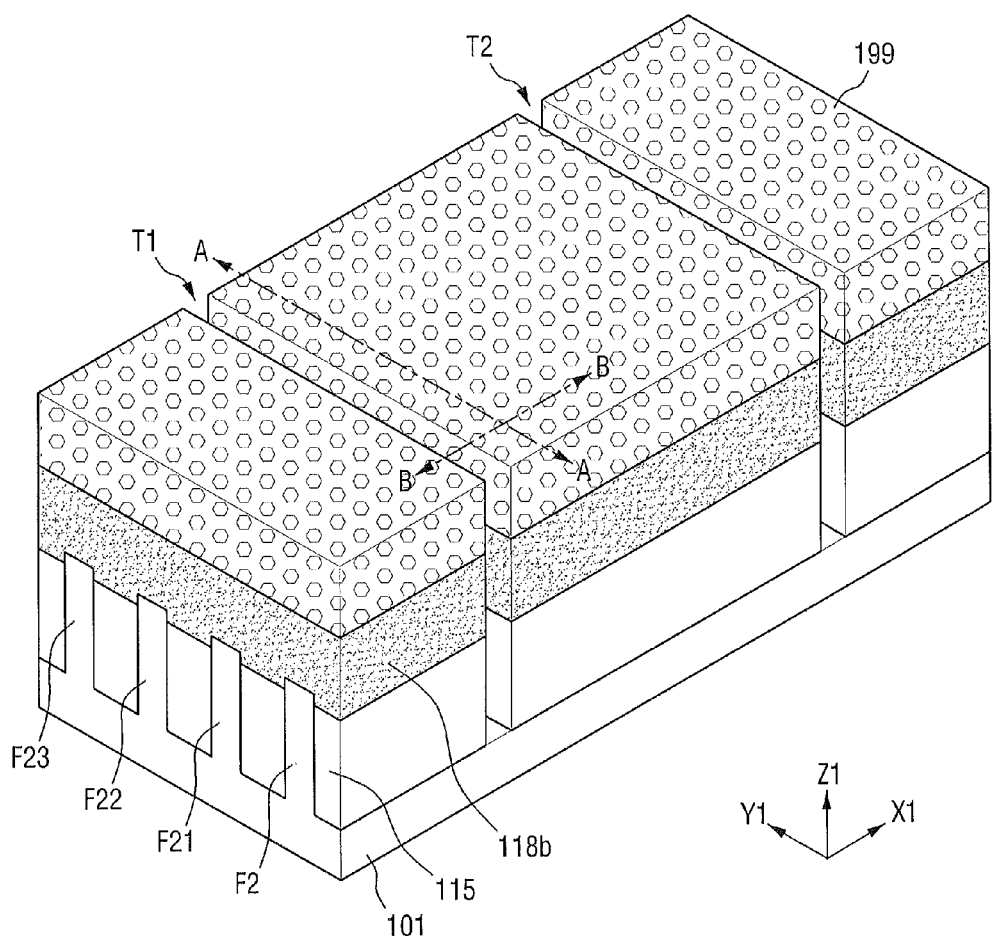
Figure 7B:
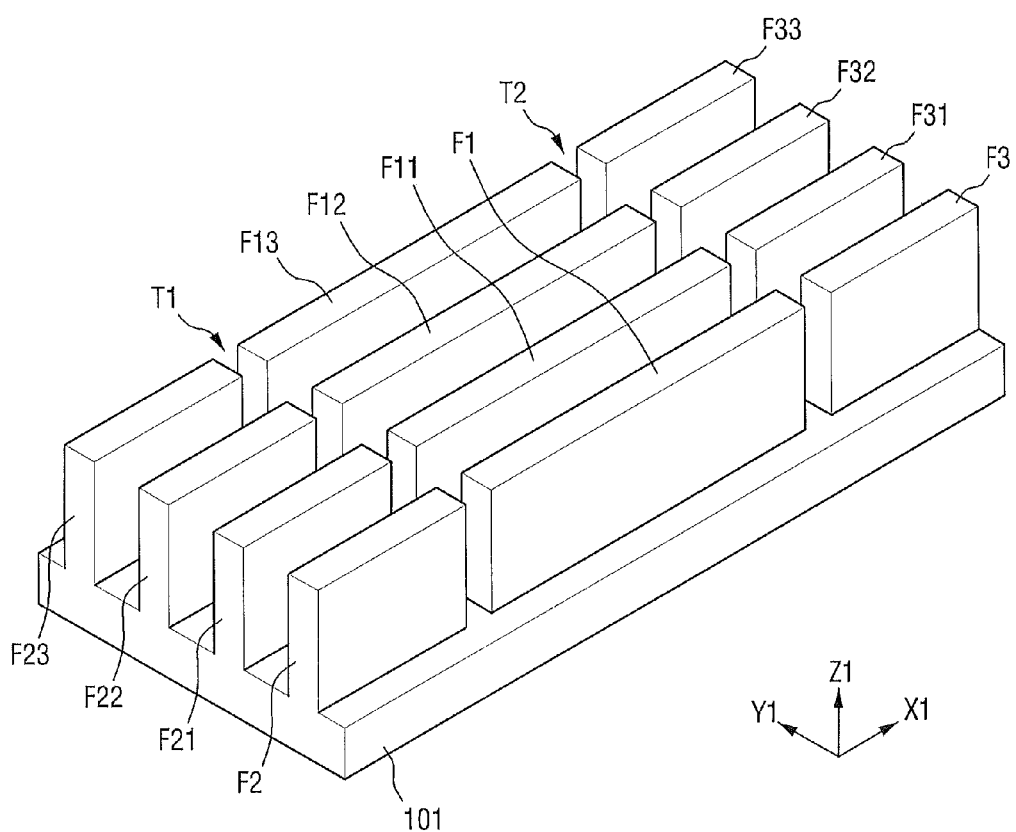
FIG. 7B is a perspective view illustrating a plurality of fins in FIG. 7A.
Figure 8:
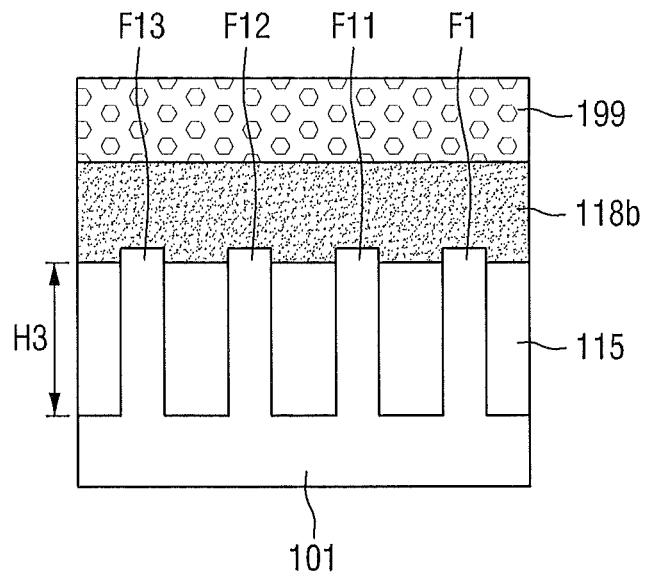

Referring to FIGS. 4 to 6, a second field insulating layer 115a is formed to surround the plurality of fins F1a, F11a, F12a and F13a. A hard mask layer 118a is formed on the plurality of fins F1a, F11a, F12a and F13a and the second field insulation layer 115a. Here, the second field insulating layer 115a may be formed to surround sidewalls of the plurality of fins F1a, F11a, F12a and F13a and to expose top surfaces of the plurality of fins F1a, F11a, F12a and F13a. In the drawings, a top surface of the second field insulating layer 115a is lower than the top surfaces of the plurality of fins F1a, F11a, F12a and F13a, but aspects of the present inventive concept are not limited thereto. For example, the top surface of the second field insulation layer 115a and the top surfaces of the plurality of fins F1a, F11a, F12a and F13a may be parallel with each other.

As shown, the second field insulating layer 115a may have a height H3.

In addition, the second field insulating layer 115a and the hard mask layer 118a may be different in etching selectivity. For example, the second field insulating layer 115a may include an oxide layer and the hard mask layer 118a may include a nitride layer, but aspects of the present inventive concept are not limited thereto.

Referring to FIGS. 7A to 9, a photoresist pattern 199, for example, is formed on the hard mask layer (118a of FIG. 4), and the plurality of fins (F1a, F11a, F12a and F13a of FIG. 4) and the hard mask layer 118a are etched using the photoresist pattern 199.

As the result, the plurality of fins F1a, F11a, F12a and F13a and the hard mask layer 118a are patterned in a second direction Y1 different from the first direction X1, thereby forming trenches T1 and T2. Accordingly, the fins are separated into respective fin structures so that end portions thereof are exposed in the trenches T1 and T2.

The plurality of fins (F1a, F11a, F12a and F13a of FIG. 4) are divided into a plurality of fins F1 to F13 centrally positioned, a plurality of fins F2 to F23 positioned in the left, and a plurality of fins F3 to F33 positioned in the right by the trenches T1 and T2. Here, the trenches T1 and T2 expose side surfaces of the patterned plurality of fins F1 to F13, F2 to F23, and F3 to F33 and side surfaces of the patterned hard mask layer 118b.

Figure 9:
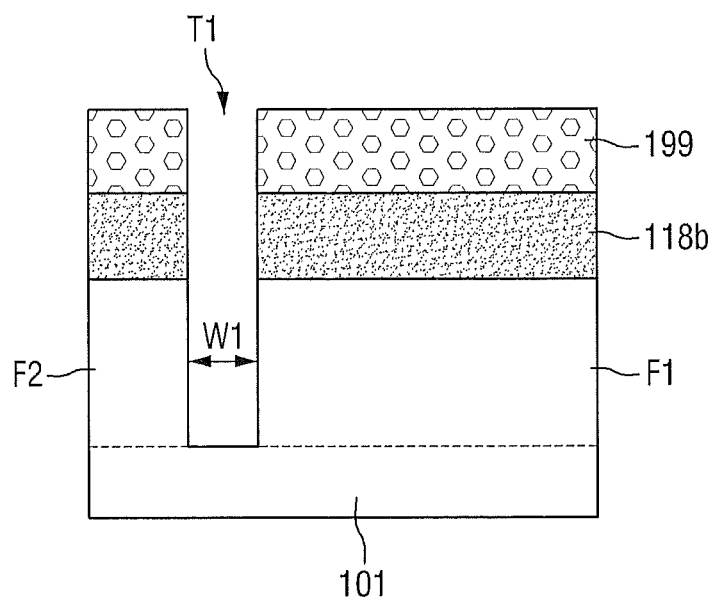

As shown in FIG. 9, widths of the trenches T1 and T2 may be W1. That is to say, widths between the plurality of fins F1 to F13 and the plurality of fins F2 to F23 may be W1, and widths between hard mask layers 118b separated from each other by the trench T1, T2, may also be W1.

Figure 10:
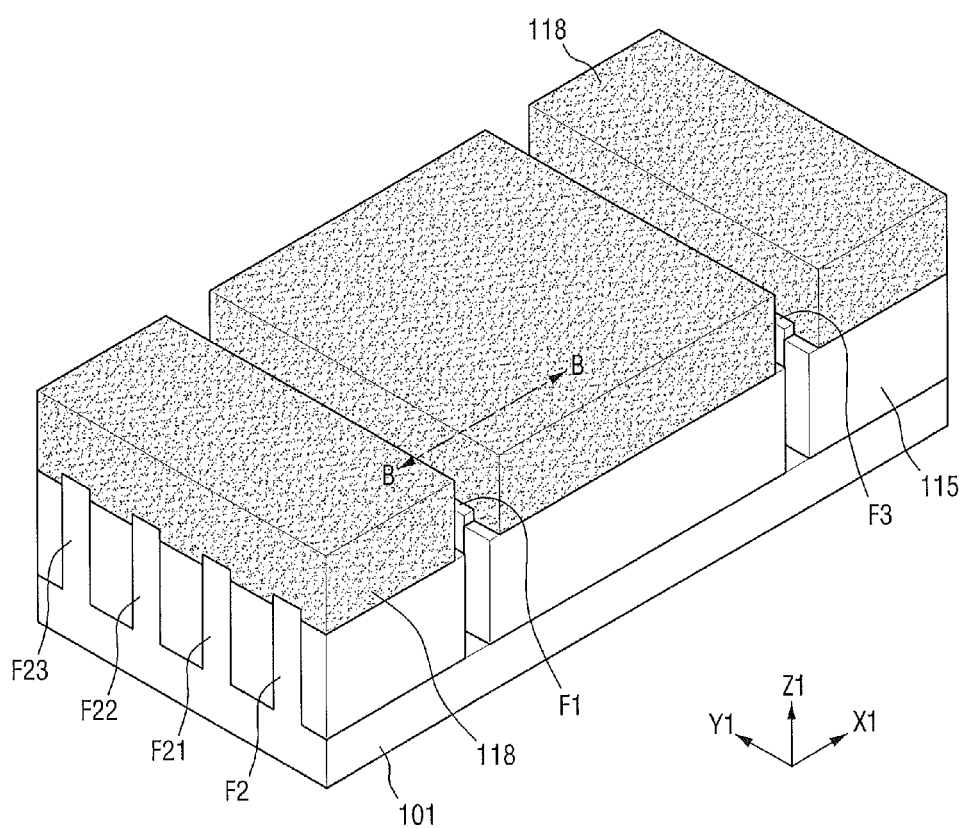
Figure 11:
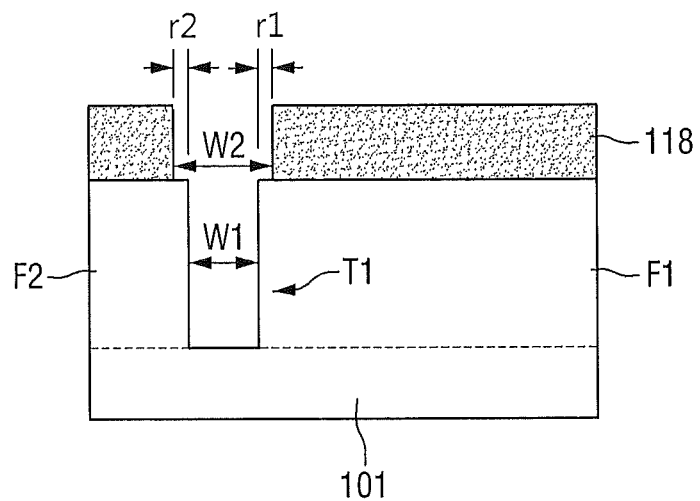

Referring to FIGS. 10 and 11, the photoresist pattern (199 of FIG. 7A) is removed. Side surfaces of the hard mask layer (118b of FIG. 7A) are etched, thereby exposing portions of the top surfaces of the plurality of fins F1 to F13, F2 to F23, and F3 to F33.

In detail, the etching of the side surfaces of the hard mask layer 118b may be performed by isotropic etching, for example, pull back etching. In the isotropic etching, a separate mask is not used. The isotropic etching may include removing a portion of the hard mask layer 118b using, for example, phosphoric acid. A portion of the top surface of the hard mask layer 118b and portions of the side surfaces of the hard mask layer 118b are removed by an etching selectivity difference, but the second field insulating layer 115 and the fins F1 to F13, F2 to F23 and F3 to F33 are hardly etched. As the result, the widths of the trenches T1 and T2 may vary. For example, the width between the plurality of fins F1 to F13 and the plurality of fins F2 to F23 may be maintained at W1, and the width between the hard mask layers 118 separated from each other may be W2, which is greater than W1.

Since isotropic etching is employed, an amount of the hard mask layer 118b etched toward the fin F1 and an amount of the hard mask layer 118b etched toward the fin F2 are substantially equal to each other. That is to say, a distance r1 increased toward the fin F1 and a distance r2 increased toward the fin F2 are equal to each other. That is to say, the distance between the hard mask layers 118, that is, W2, may be equal to W1+r1+r2, and r1 and r2 may be equal to each other. Accordingly, the etching of the hard mask layer 118b can expose end corners of the separated fin structures exposed in the trenches T1 and T2.

Figure 12:
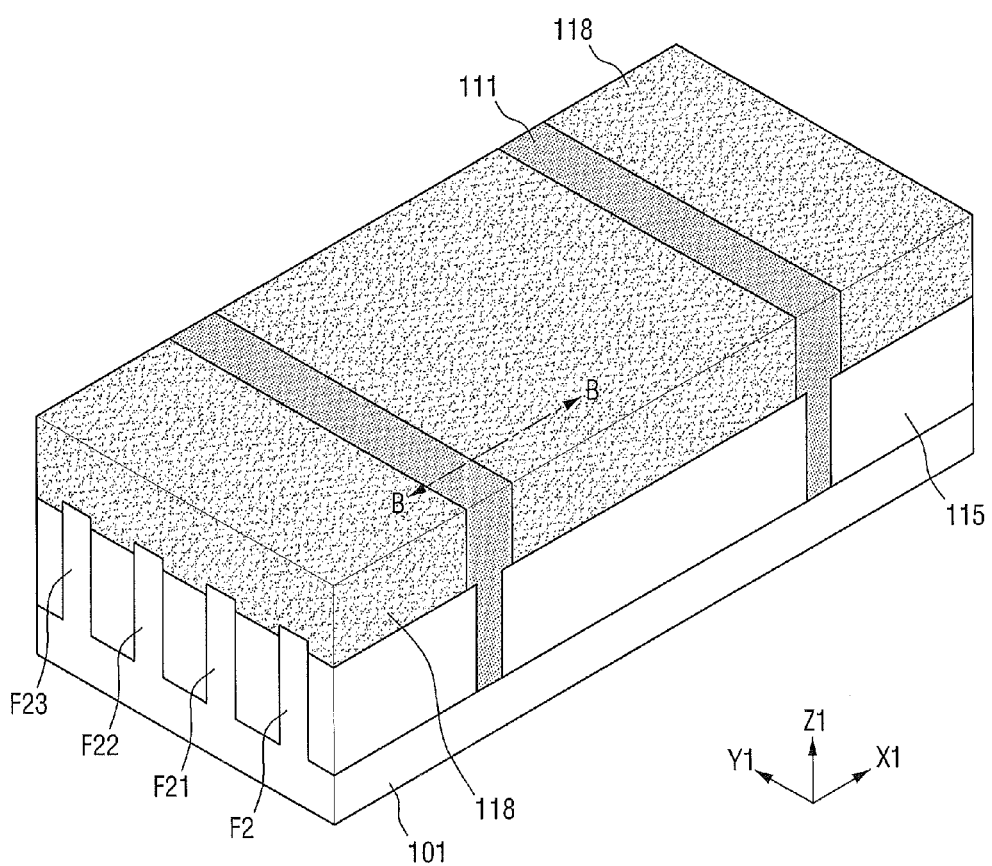
Figure 13:
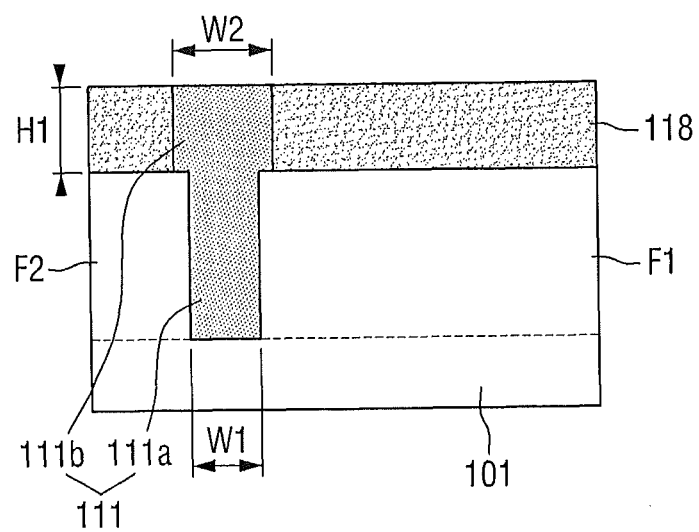

Referring to FIGS. 12 and 13, a first field insulation layer 111 is formed to fill the trenches T1 and T2 and to cover and conform to the exposed end corners of the fins F1 to F13, F2 to F23 and F3 to F33.

In detail, an insulating layer sufficiently filling the trenches T1 and T2 and the hard mask layer 118 is formed, and the first field insulating layer 111 is then completed through, for example, chemical mechanical polishing (CMP). As shown, a top surface of the first field insulating layer 111 and a top surface of the hard mask layer 118 may be on the same level with (or arranged abreast of) each other.

Therefore, the first field insulating layer 111 may include a first region 111a between fins (e.g., F1 and F2) and a second region 111b protruding relative to the fins (e.g., F1 and F2). The width W2 of the second region 111b may be greater than the width W1 of the first region 111a. In addition, the second region 111b may have a height H1. That is to say, the first field insulating layer 111 may be T-shaped.

The first field insulating layer 111 may be an oxide layer. In addition, the first field insulating layer 111 may be made of the same material with the second field insulating layer 115, but aspects of the present inventive concept are not limited thereto.

As described above, as the result of performing the isotropic etching, the recessed distance r1 increased toward the first fin F1 and the recessed distance r2 increased toward the second fin F2 are equal to each other. Thus, an overlap length of the second region 111b of the first field insulating layer 111 and the first fin F1 and an overlap length of the second region 111b and the second fin F2 may be equal to each other.

Figure 14:
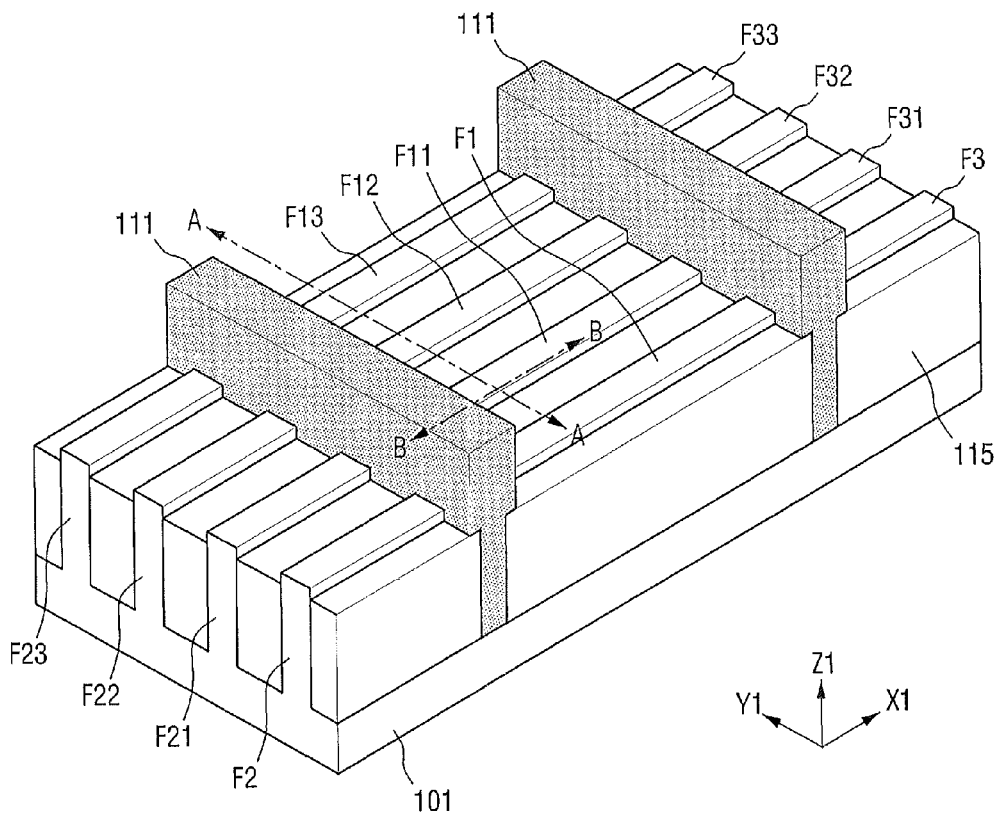
Figure 15:
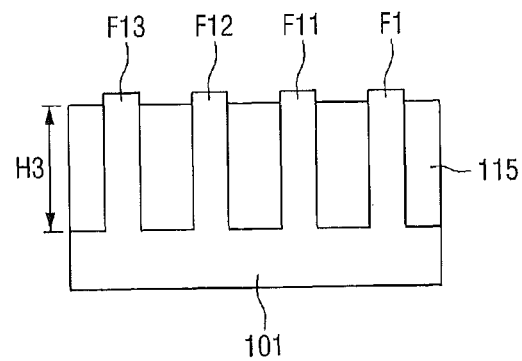
Figure 16:
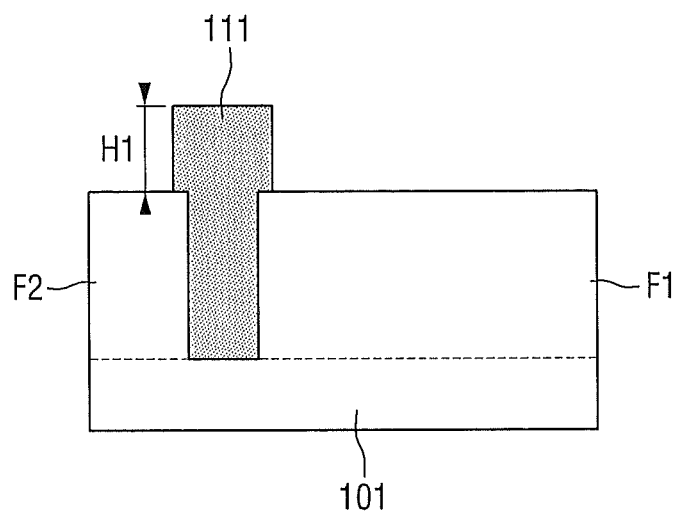

Referring to FIGS. 14 to 16, the hard mask layer 118 is removed.

Figure 17:
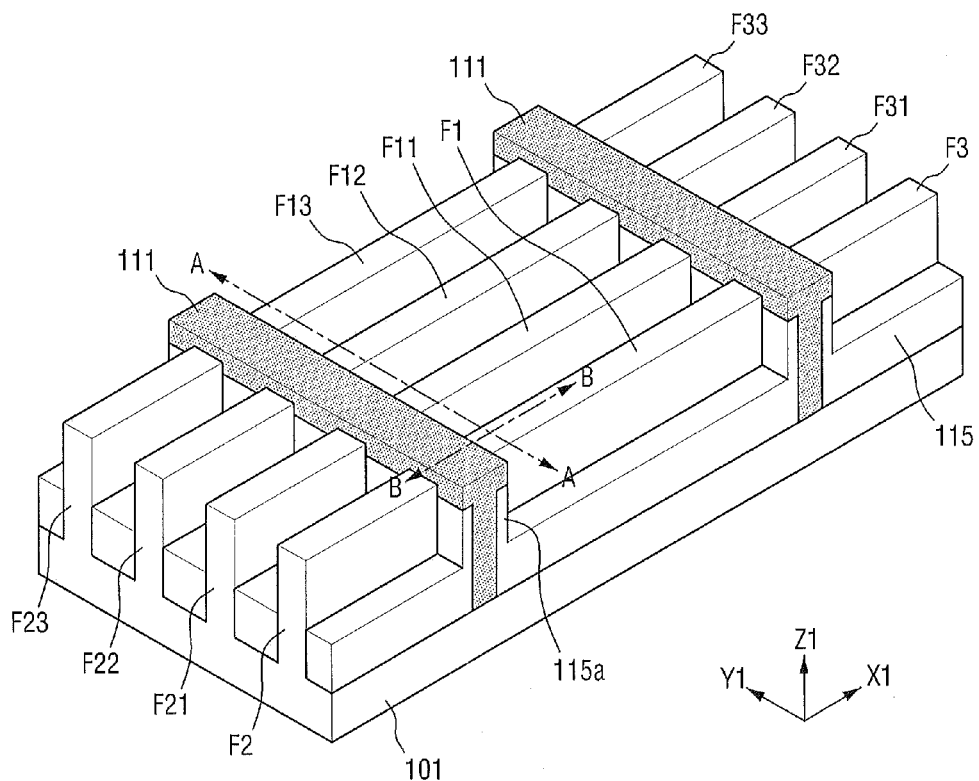
Figure 18:
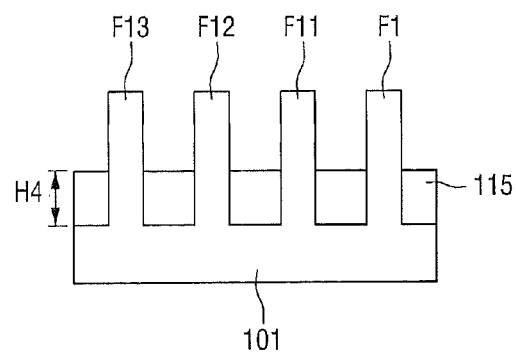
Figure 19:
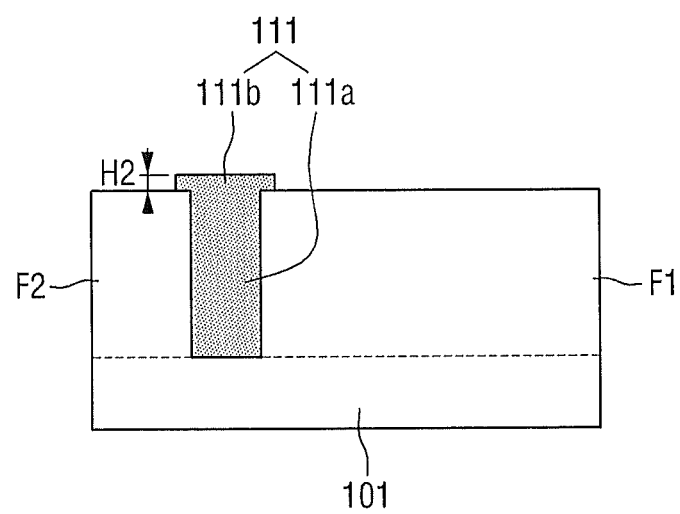

Referring to FIGS. 17 to 19, heights of the first field insulating layer 111 and the second field insulating layer 115 are reduced.

In detail, when the heights of the first field insulating layer 111 and the second field insulating layer 115 are reduced, a separate mask may not be needed.

As described above, the first field insulating layer 111 and the second field insulating layer 115 may be made of the same material. Therefore, when the first field insulating layer 111 and the second field insulating layer 115 are etched, an etched amount (i.e., a reduced height) of the first field insulating layer 111 and an etched amount (i.e., a reduced height) of the second field insulating layer 115 may be substantially the same. Thus, as shown in FIG. 18, the height of the second field insulating layer 115 may be reduced from H3 (see FIG. 15) to H4. As shown in FIG. 19, the height of the first field insulating layer 111 may be reduced from H1 (see FIG. 16) to H2. That is to say, the top surface of the first field insulating layer 111 may be higher than the top surfaces of the fins F1 to F13, F2 to F23 and F3 to F33, and the top surface of the second field insulating layer 115 may be lower than the top surfaces of the fins F1 to F13, F2 to F23 and F3 to F33.

The reduced height of the first field insulating layer 111 and the reduced height of the second field insulating layer 115 may be adjusted as needed.

Meanwhile, a portion 115a of the second field insulating layer 115 may be positioned below the first field insulating layer 111. Since the portion 115a of the second field insulating layer 115 is covered by the first field insulating layer 111, it may be less etched than the other portion of the second field insulating layer 115.

Figure 20:
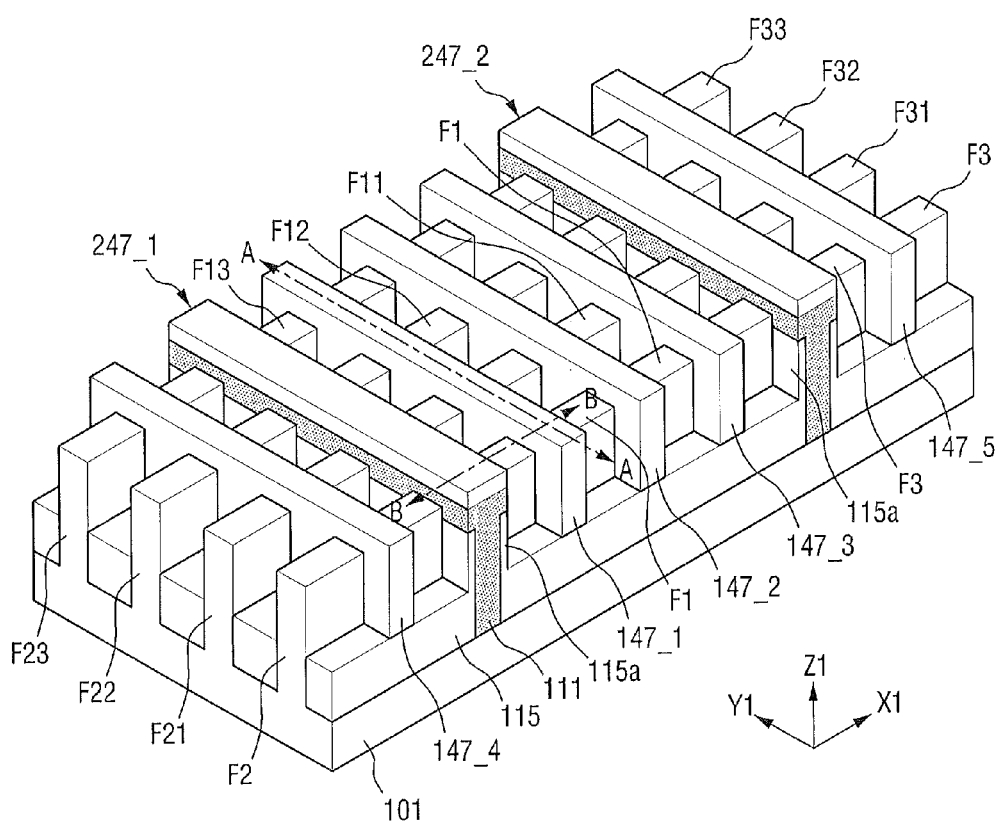
Figure 21:
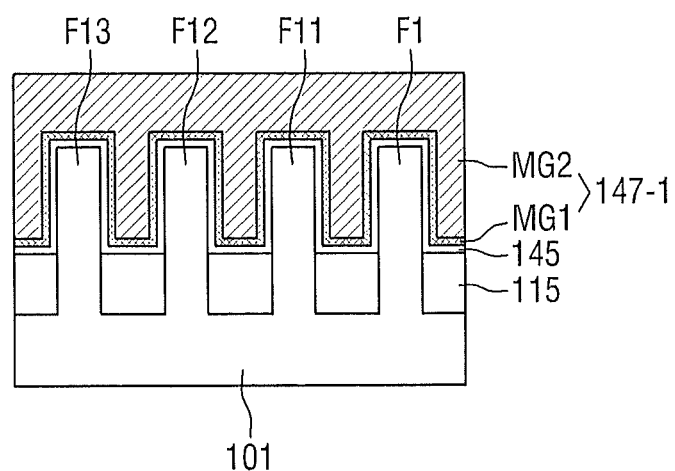
Figure 22:
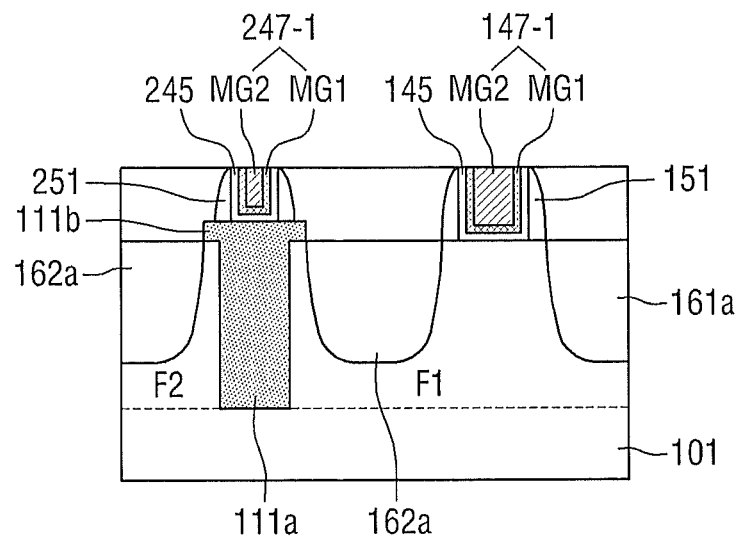

Referring to FIGS. 20 to 22, a plurality of dummy gates 247_1 and 247_2 are formed on the first field insulating layer 111, and a plurality of active gates 147_1 to 147_5 are formed to cross the plurality of fins F1 to F13, F2 to F23, and F3 to F33. Next, sources/drains 161a and 162a are formed, thereby completing the semiconductor device 1.

In detail, the plurality of active gates 147_1 to 147_5 may be formed on the fins F1 to F13, F2 to F23 and F3 to F33 corresponding to the plurality of active gates 147_1 to 147_5 to cross the corresponding fins F1 to F13, F2 to F23 and F3 to F33. For example, first to third active gates 147_1, 147_2 and 1473 may be formed on the fins F1 to F13, a fourth active gate 147_4 may be formed on the fins F2 to F23, and a fifth active gate 147_5 may be formed on the fins F3 to F33. The active gates 147_1 to 147_5 may extend in the second direction Y1.

The plurality of dummy gates 247_1 and 247_2 may be formed on the corresponding first field insulating layer 111. For example, the first dummy gate 247_1 may be formed on the first field insulating layer 111 shown in the left side of FIG. 20, and the second dummy gate 247_2 may be formed on the first field insulating layer 111 shown in the right side of FIG. 20. In particular, the dummy gates 247_1 and 247_2 may be formed on the corresponding first field insulating layer 111 one by one. As the dummy gates 247_1 and 247_2 are formed one by one, rather than two or more of the dummy gates 247_1 and 247_2 being formed, the layout size can be reduced.

Referring to FIGS. 21 and 22, each active gate (e.g., 147_1) may include metal layers MG1 and MG2. As shown in FIGS. 21 and 22, the active gate 147_1 may be configured such that two or metal layers MG1 and MG2 are stacked. The first metal layer MG1 may control a work function, and the second metal layer MG2 may fill a space formed by the first metal layer MG1. For example, the first metal layer MG1 may include at least one of TiN, TaN, TiC, and TaC. In addition, the second metal layer MG2 may include W or Al. The active gate 147_1 may be formed by, for example, a replacement process or a gate last process, but aspects of the present inventive concept are not limited thereto. The gate insulation layer 145 of the active gate 147_1 may be formed between the fins F1 to F13 and the active gate 147_1. As shown in FIG. 21, the gate insulation layer 145 may be formed on top surfaces and side surfaces of the fins F1 to F13. The gate insulation layer 145 may include a high-k material having a higher dielectric constant than a silicon oxide layer. For example, the gate insulation layer 145 may include $HfO_2$, $ZrO_2$ or $Ta_2O_5$.

The source/drain 161a may be formed between neighboring active gates 147_1.

Each dummy gate (e.g., 247_1) may have a configuration similar to that of the active gate 147_1. As shown, the dummy gate 247_1 may be configured such that two or metal layers MG1 and MG2 are stacked. For example, the first metal layer MG1 may control a work function, and the second metal layer MG2 may fill a space formed by the first metal layer MG1. The gate insulation layer 245 of the dummy gate 247_1 may include a high-k material having a higher dielectric constant than a silicon oxide layer.

The source/drain 162a may be formed between the dummy gate (e.g., 247_1) and the active gate 147_1. In some embodiments, the dummy gates can include a conductive layer.

Top surfaces of the dummy gates 247_1 and 247_2 and top surfaces of the active gates 147_1 to 147_5 may be on the same level with (or arranged abreast of) each other. The dummy gates 247_1 and 247_2 are formed on the first field insulation layer 111, and the active gates 147_1 to 147_5 are formed on the corresponding fins F1 to F13, F2 to F23 and F3 to F33. Therefore, the dummy gates 247_1 and 247_2 may be positioned higher than the active gates 147_1 to 147_5.

Figure 23:
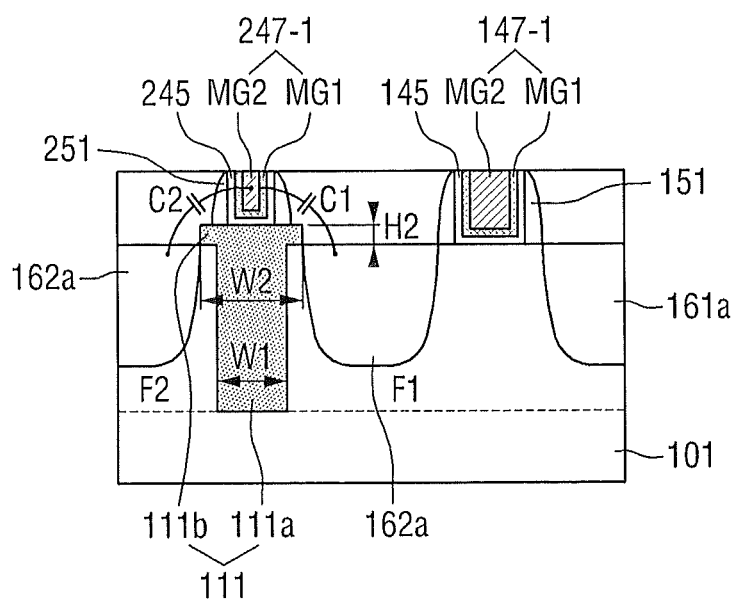
FIG. 23 illustrates effects of the semiconductor device formed according to some embodiments of the present inventive concept.

Effects of the semiconductor device in some embodiments of the present inventive concept illustrated in FIGS. 1-22 described with reference to FIG. 23, according to FIG. 23 since the top surface of the first field insulating layer 111 and the top surfaces of the fins F1 and F2 are on the same level with (or arranged abreast of) each other, or the top surface of the first field insulating layer 111 is higher than the top surfaces of the fins F1 and F2, the dummy gate 247_1 is not positioned at a space between the first fin F1 and the second fin F2. As shown, the top surface of the first field insulating layer 111 may protrude by H2 relative to the top surfaces of the fins F1 and F2.

Therefore, magnitudes of parasitic capacitance C1 formed between the dummy gate 247_1 and the first fin F1 and parasitic capacitance C2 formed between the dummy gate 247_1 and the second fin F2 are small. In addition, there is little contact area between the dummy gate 247_1 and the first fin F1 or between the dummy gate 247_1 and the second fin F2. Thus, an amount of leakage current may be small.

In addition, the first field insulating layer 111 includes the first region 111a between the fins (e.g., F1 and F2) and the second region 111b protruding relative to the fins (e.g., F1 and F2). The width W2 of the second region 111b may be greater than the width W1 of the first region 111a. That is to say, the dummy gate 247_1 may be formed in a wide area. Therefore, the dummy gate 247_1 and the first field insulating layer 111 may be well aligned, and the dummy gate 247_1 may be unlikely to be formed in a region other than the first field insulating layer 111.

In addition, as shown, the width W1 of the dummy gate 247_1 may be smaller than the width W2 of the second region 111b. In this case, since the width W2 of the second region 111b is sufficiently greater than the width W1 of the dummy gate 247_1, a misalignment margin can be provided.

Figure 24:
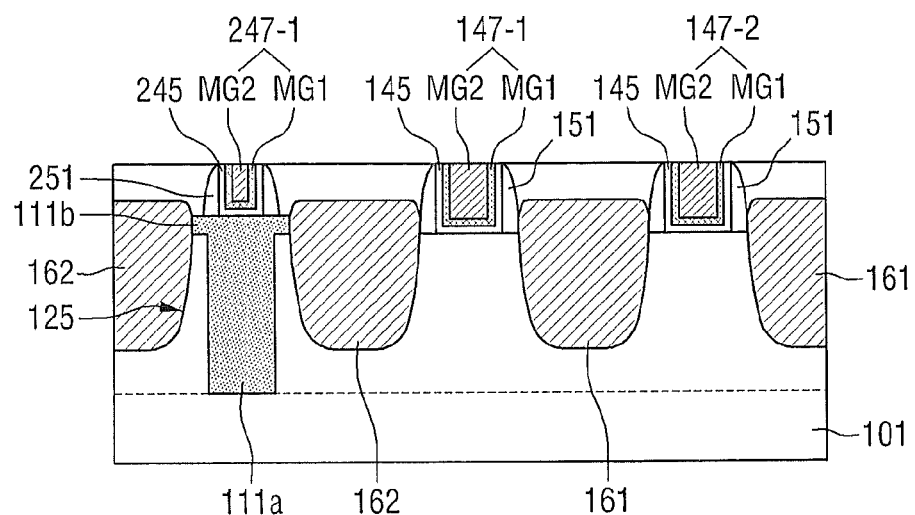
FIG. 24 is a cross-sectional view illustrating methods of forming semiconductor devices according to some embodiments of the present inventive concept.

FIG. 24 is a cross-sectional view illustrating methods of forming semiconductor devices according to some embodiments of the present inventive concept. Referring to FIG. 24, recesses 125 may be formed in fins F1 to F13, F2 to F23 and F3 to F33 between a plurality of active gates 147_1 to 147_5 and active gates 147_1 to 147_5 and dummy gates 247_1 and 247_2.

A first source/drain 161 and a second source/drain 162 are formed in the recesses 125. Each of the first source/drain 161 and the second source/drain 162 may include an epitaxial layer. That is to say, the first source/drain 161 and the second source/drain 162 may be formed by epitaxial growth. In addition, the sources/drains 161 and 162 may be an elevated source/drain protruding relative to the fins F1 to F13, F2 to F23 and F3 to F33.

In particular, as shown, a top surface of the first source/drain 161 and a top surface of the second source/drain 162 may be on the same level with (or arranged abreast of) each other. That is to say, the second source/drain 162 may grow at the same rate as the first source/drain 161 because the first source/drain 161 and the second source/drain 162 are formed under the same processing conditions. The first active gate 147_1 and the second active gate 127_2 are disposed at both sides of the first source/drain 161, and the dummy gate 247_1 and the first active gate 147_1 are disposed at both sides of the second source/drain 162. Therefore, recesses 125 for forming the first source/drain 161 and the second source/drain 162 are formed under the same processing conditions, that is, the same processing conditions of epitaxial growth. Therefore, the second source/drain 162 may grow at substantially the same rate as the first source/drain 161.

In the case where the structure shown in FIG. 24 is a PMOS transistor, the sources/drains 161 and 162 may include a compressive stress material. For example, the compressive stress material may be a material having a larger lattice constant than silicon (Si), for example, SiGe. The compressive stress material may improve the mobility of carriers (holes) of a channel region by applying compressive stress to a fin (e.g., F1 or F2). However, in the case of an NMOS transistor, the sources/drains 161 and 162 may include the same material as the substrate 101 or a tensile stress material. For example, when substrate 101 includes Si, the sources/drains 161 and 162 may include Si or a material having a smaller lattice constant than Si (e.g., SiC). The tensile stress material may improve the mobility of carriers (holes) of a channel region by applying tensile stress to a fin (e.g., F1 or F2).

Figure 25:
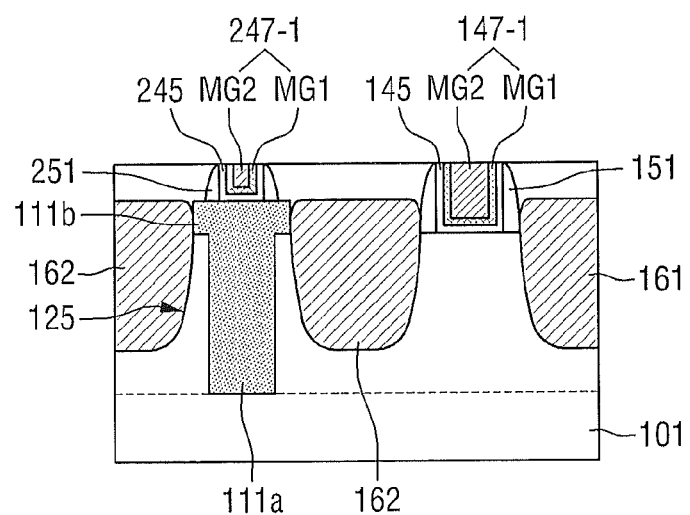
FIG. 25 is a cross-sectional view illustrating methods of forming semiconductor devices according to some embodiments of the present inventive concept.

FIG. 25 is a cross-sectional view illustrating methods of forming semiconductor devices according to some embodiments of the present inventive concept.

Referring to FIG. 25, a first field insulating layer 111 may include a first region 111a between fins (e.g., F1 and F2) and a second region 111b protruding relative to the fins (e.g., F1 and F2). A top surface of the second region 111b may be on the same level with top surfaces of the sources/drains 161 and 162 or may upwardly protrude more than the top surfaces of the sources/drains 161 and 162.

Figure 26:
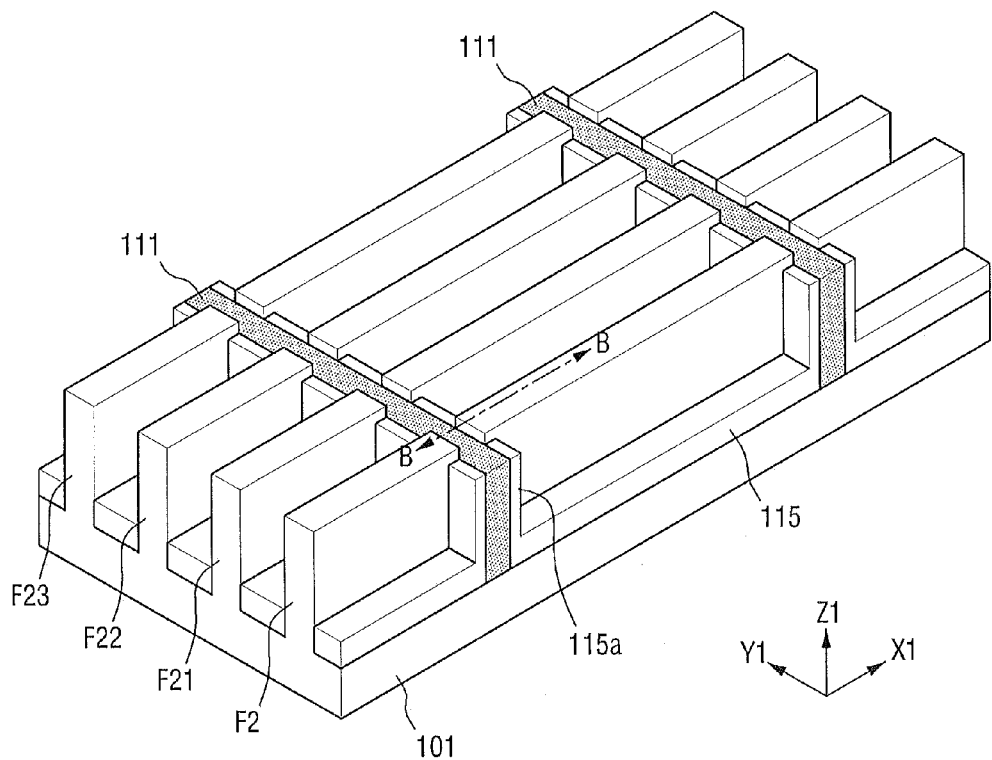
FIGS. 26 and 27 are cross-sectional views illustrating methods of forming semiconductor devices according to some embodiments of the present inventive concept.
Figure 27:
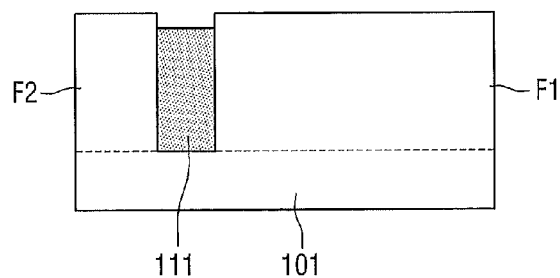
Figure 28:
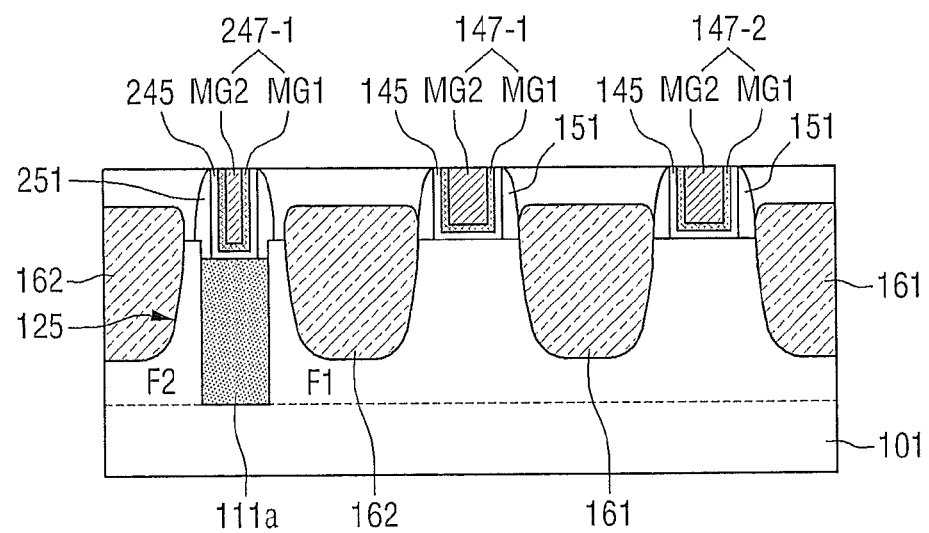
FIG. 28 is a cross-sectional view of the semiconductor device formed according to some embodiments of the present inventive concept.

FIGS. 26 and 27 are cross-sectional views illustrating methods of forming semiconductor devices according to some embodiments of the present inventive concept. It will be understood that the operations carried out in FIGS. 26 and 27 may be performed rather than the operations shown in FIGS. 17 to 19. FIG. 28 is a cross-sectional view of the semiconductor device in some embodiments of the present inventive concept.

Referring first to FIGS. 26 and 27, heights of the first field insulating layer 111 and the second field insulating layer 115 are reduced. A top surface of the first field insulating layer 111 may be controlled to be lower than top surfaces of the fins F1 to F13, F2 to F23 and F3 to F33.

As described above, since a portion 115a of a fifth field insulating layer 115 is covered by the first field insulating layer 111 (see FIG. 14), it may be less etched than the other portion of the second field insulating layer 115.

Referring to FIG. 28, a plurality of dummy gates (e.g., 247_1) are formed on the corresponding first field insulating layer 111. Since the top surface of the first field insulating layer 111 is lower than the top surfaces of the fins F1 to F13, F2 to F23 and F3 to F33, the dummy gate (e.g., 247_1) may be positioned on the first field insulating layer 111, and a spacer 251 may be formed on fins F1 and F2.

Figure 29:
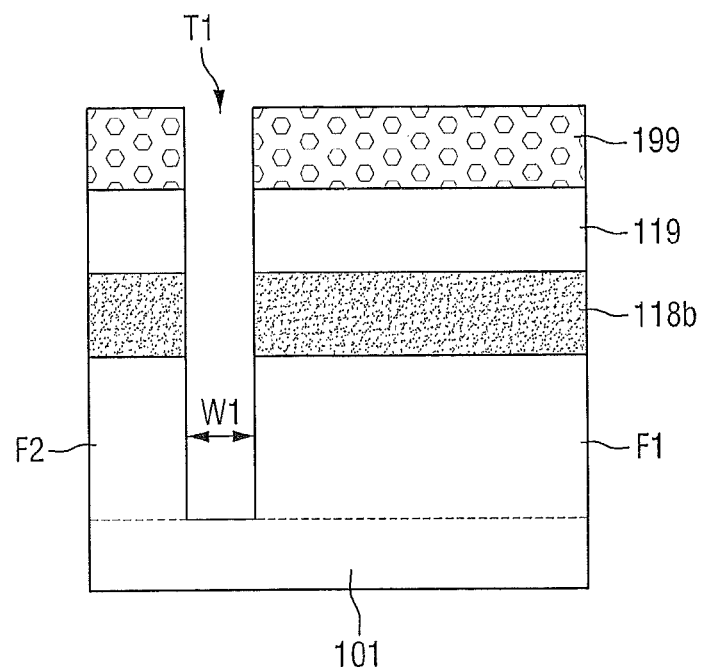
FIGS. 29 and 30 are cross-sectional views illustrating methods of forming semiconductor devices according to some embodiments of the present inventive concept.
Figure 30:
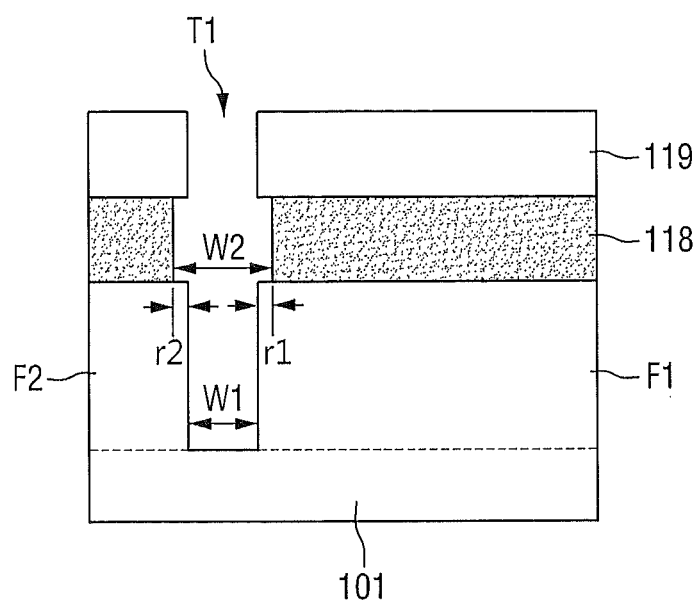

FIGS. 29 and 30 are cross-sectional views illustrating methods of forming semiconductor devices according to some embodiments of the present inventive concept. It will be understood that the operations shown in FIG. 29 can be performed rather than the operations shown in FIG. 9.

Referring to FIG. 29, unlike described above where the hard mask layer (118b of FIG. 9) is a single layer (i.e., a nitride layer), hard mask layers 118b and 119 may be multiple layers. The hard mask layers 118b and 119 may include a stack of a nitride layer 118b and an oxide layer 119. As shown in FIG. 29, the oxide layer 119 may be positioned on the nitride layer 118b.

A plurality of fins (F1a, F11a, F12a and F13a of FIG. 4) and the hard mask layers 118b and 119 are patterned in a second direction Y1 different from a first direction X1, thereby forming a trench (e.g., T1).

As shown in FIG. 29, the trench (e.g., T1) may have a width W1. That is to say, the width between the plurality of fins (e.g., F1 to F13) and the plurality of fins (e.g., F2 to F23) may be W1, and the width between the hard mask layers 118b and 119 separated from each other may also be W1.

Referring to FIG. 30, side surfaces of the hard mask layers 118b and 119 are etched, thereby exposing portions of top surfaces of the fins F1 to F13, F2 to F23 and F3 to F33. As described above, the side surfaces of the hard mask layers 118b and 119 may be etched by isotropic etching. Portions of the hard mask layers 118b and 119 may be removed using, for example, phosphoric acid. Portions of the side surfaces of the nitride layer 118b are removed by a difference in the etching selectivity to phosphoric acid. However, the oxide layer 119 and the fins F1 to F13, F2 to F23 and F3 to F33 are hardly etched.

Since the oxide layer 119 is positioned on the nitride layer 118b, a height of the nitride layer 118 is not reduced even by performing isotropic etching.

In addition, widths of the trenches T1 and T2 may vary. For example, the width between the plurality of fins F1 to F13 and the plurality of fins F2 to F23 may be maintained at W1, and the width between the nitride layers 118 separated from each other may be W2, which is greater than W1.

Since isotropic etching is employed, an amount of the hard mask layer 118b removed toward the fin F1 and an amount of the hard mask layer 118b removed toward the fin F2 are substantially equal to each other. That is to say, a recessed distance r1 increased toward the fin F1 and a recessed distance r2 increased toward the fin F2 are equal to each other. That is to say, the distance between the hard mask layers 118, that is, W2, may be equal to W1+r1+r2, and r1 and r2 may be equal to each other.

FIGS. 31 to 43 are cross-sectional views illustrating methods of forming semiconductor devices according to some embodiments of the present inventive concept. It will be understood that the operations shown in FIGS. 31 to 43 can be performed rather than the operations shown in FIGS. 1 to 13.

Figure 31:
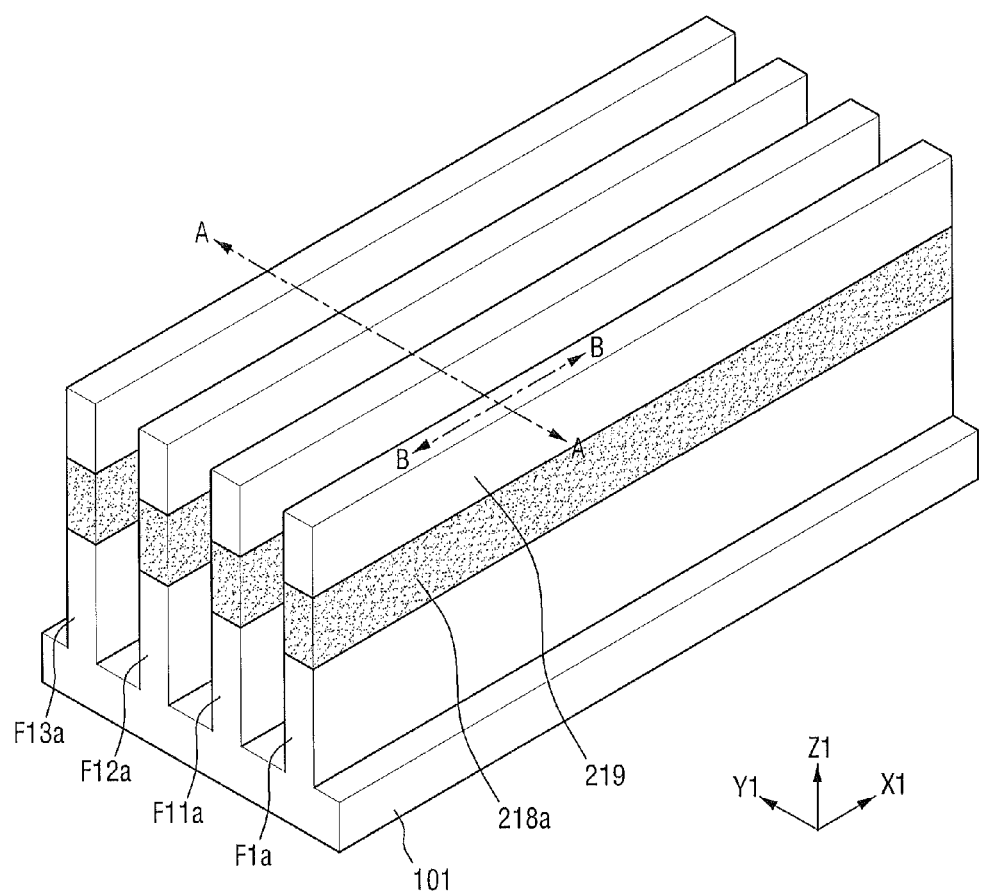
FIGS. 31 to 43 are cross-sectional views illustrating methods of forming semiconductor devices according to some embodiments of the present inventive concept.
Figure 32:
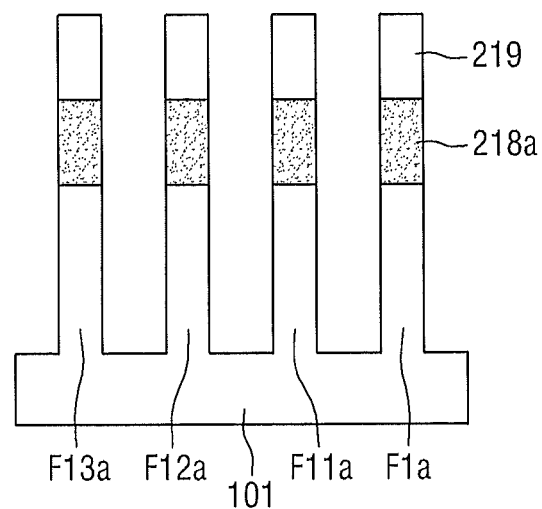
Figure 33:
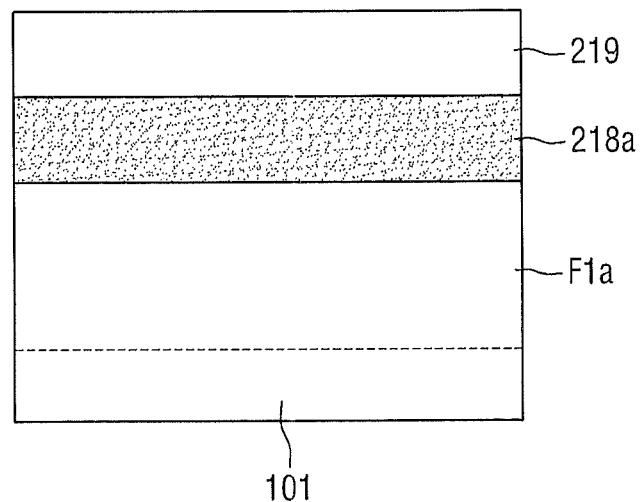

Referring first to FIGS. 31 to 33, a plurality of fins F1a, F11a, F12a and F13a extend in a first direction X1 to be spaced apart from each other, and a plurality of hard mask layers 218a and 219 are formed on the plurality of fins F1a, F11a, F12a and F13a.

Here, the plurality of fins F1a, F11a, F12a and F13a may be formed using the hard mask layers 218a and 219. That is to say, the plurality of hard mask layers 218a and 219 spaced apart from each other and extending in the first direction X1 may be formed on a substrate 101, and the plurality of fins F1a, F11a, F12a and F13a may be formed in the substrate 101 using the plurality of hard mask layers 218a and 219.

Figure 34:
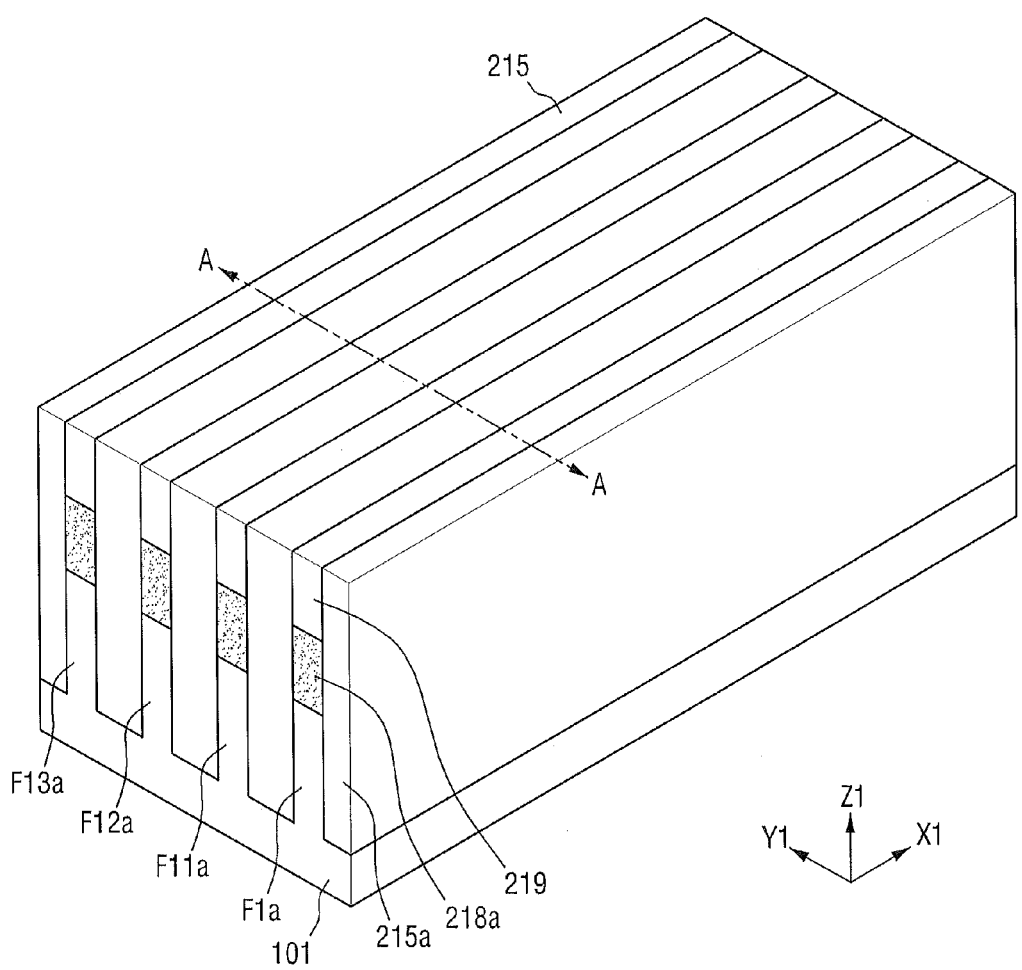
Figure 35:
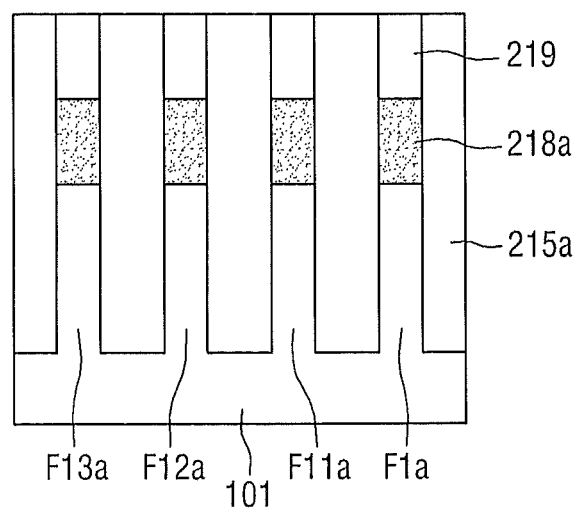

Referring to FIGS. 34 and 35, a second field insulating layer 215a is formed to surround the plurality of fins F1a, F11a, F12a and F13a. The second field insulating layer 215a surrounds sidewalls of the plurality of fins F1a, F11a, F12a and F13a and sidewalls of the hard mask layers 218a and 219. A top surface of the second field insulating layer 215a and top surfaces of the hard mask layers 218a and 219 may be on the same level with (or abreast of) each other.

Figure 36:
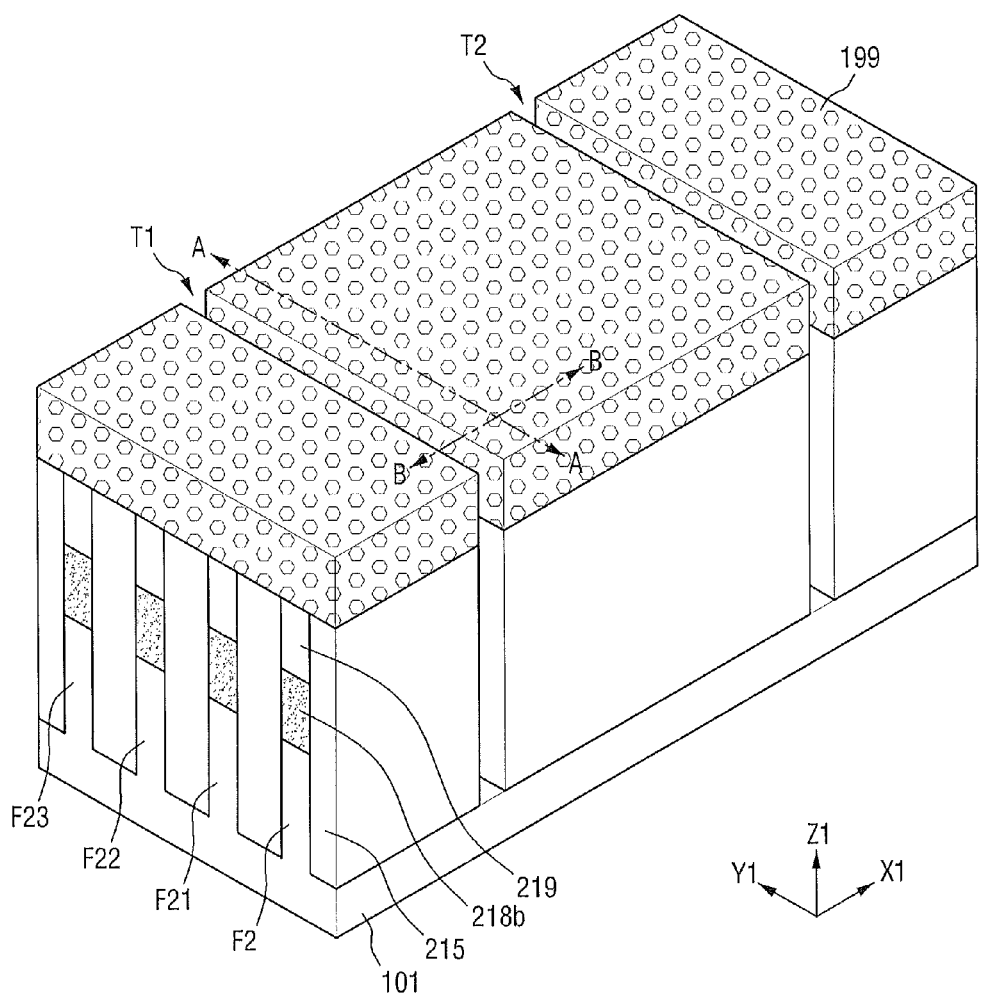
Figure 37:
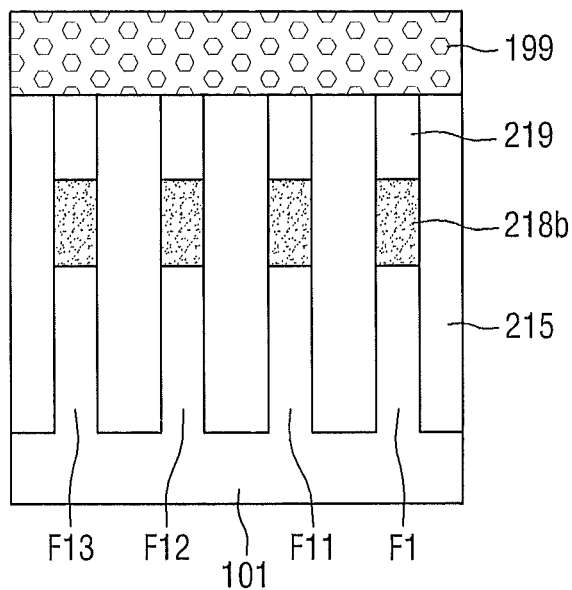
Figure 38:
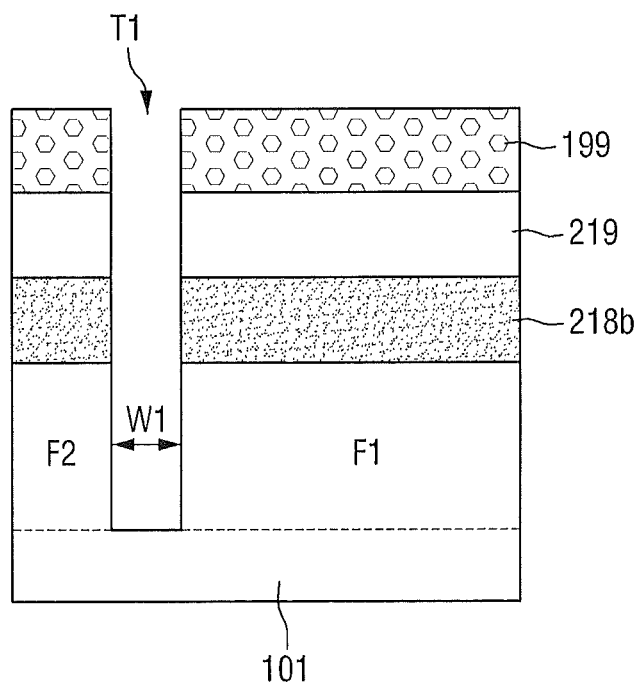

Referring to FIGS. 36 to 38, a photoresist pattern 199, for example, is formed on the hard mask layers 218a and 219, and the plurality of fins F1a, F11a, F12a and F13a and the hard mask layers 218a and 219 are etched using the photoresist pattern 199.

As the result, the plurality of fins F1a, F11a, F12a and F13a and the hard mask layers 218a and 219 are patterned in a second direction Y1 different from the first direction X1, thereby forming trenches T1 and T2.

Here, the trenches T1 and T2 expose side surfaces of the patterned plurality of fins F1 to F13, F2 to F23, and F3 to F33 and side surfaces of the patterned hard mask layers 218b and 219.

Figure 39:
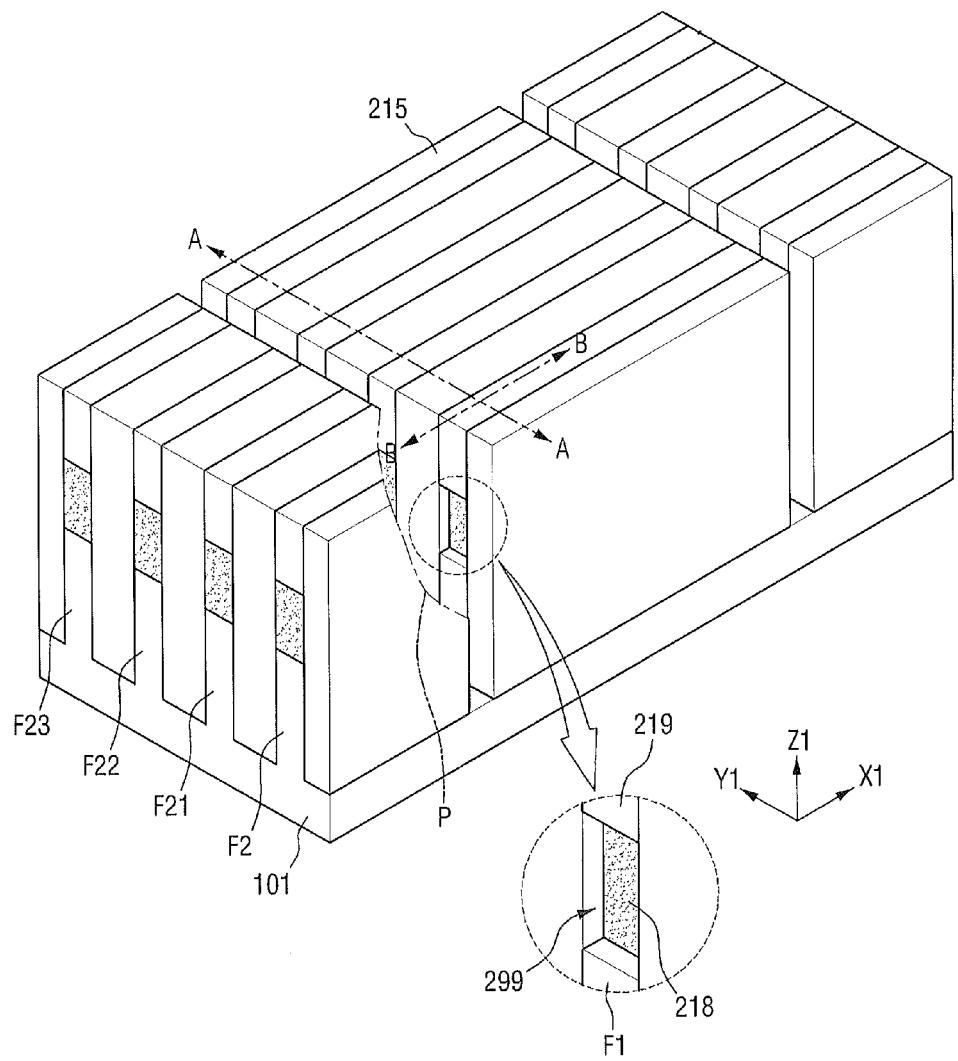
Figure 40:
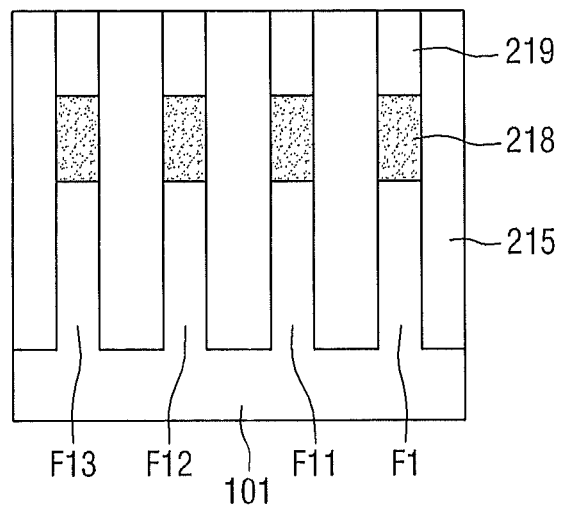
Figure 41:
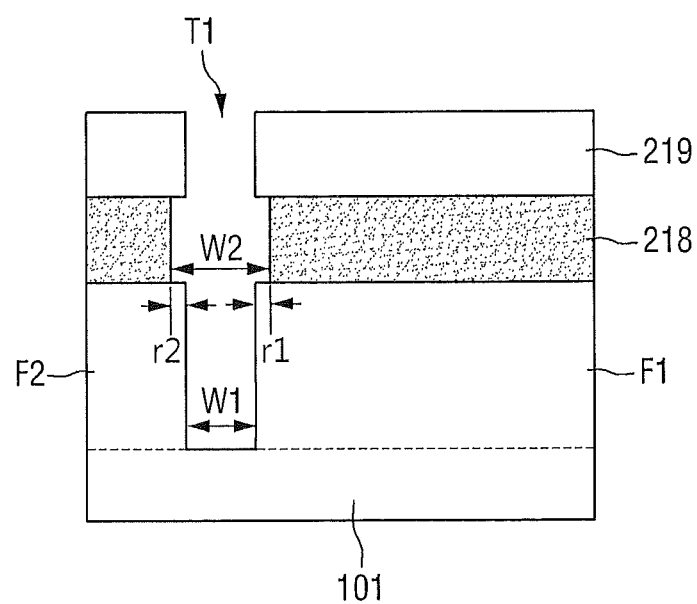

Referring to FIGS. 39 to 41, the photoresist pattern 199 is removed. Next, the side surfaces of the hard mask layers 218b and 219 are etched, thereby exposing portions of top surfaces of the fins F1 to F13, F2 to F23 and F3 to F33.

FIG. 39 is a partly extracted view illustrating a groove 299 taken along an arbitrary imaginary line P.

In detail, the etching of the side surfaces of the hard mask layers 218b and 219 may be performed by isotropic etching. Portions of the hard mask layers 218b and 219 may be removed using, for example, phosphoric acid. Portions of the side surfaces of the nitride layer 218b are removed by a difference in the etching selectivity to phosphoric acid. However, the oxide layer 219, the second field insulating layer 215 and the fins F1 to F13, F2 to F23 and F3 to F33 are etched markedly less. As the result, since the sidewalls of the nitride layer 218b are etched but the sidewall of the oxide layer 219 is etched markedly less, the nitride layer 218b is recessed, thereby forming the groove 299.

Meanwhile, since the isotropic etching is employed, an amount of the hard mask layer 218b removed toward the fin F1 and an amount of the hard mask layer 218b removed toward the fin F2 are substantially equal to each other. That is to say, a recessed distance r1 increased toward the fin F1 and a recessed distance r2 increased toward the fin F2 are equal to each other. That is to say, the distance between the hard mask layers 218, that is, W2, may be equal to W1+r1+r2, and r1 and r2 may be equal to each other.

Figure 42:
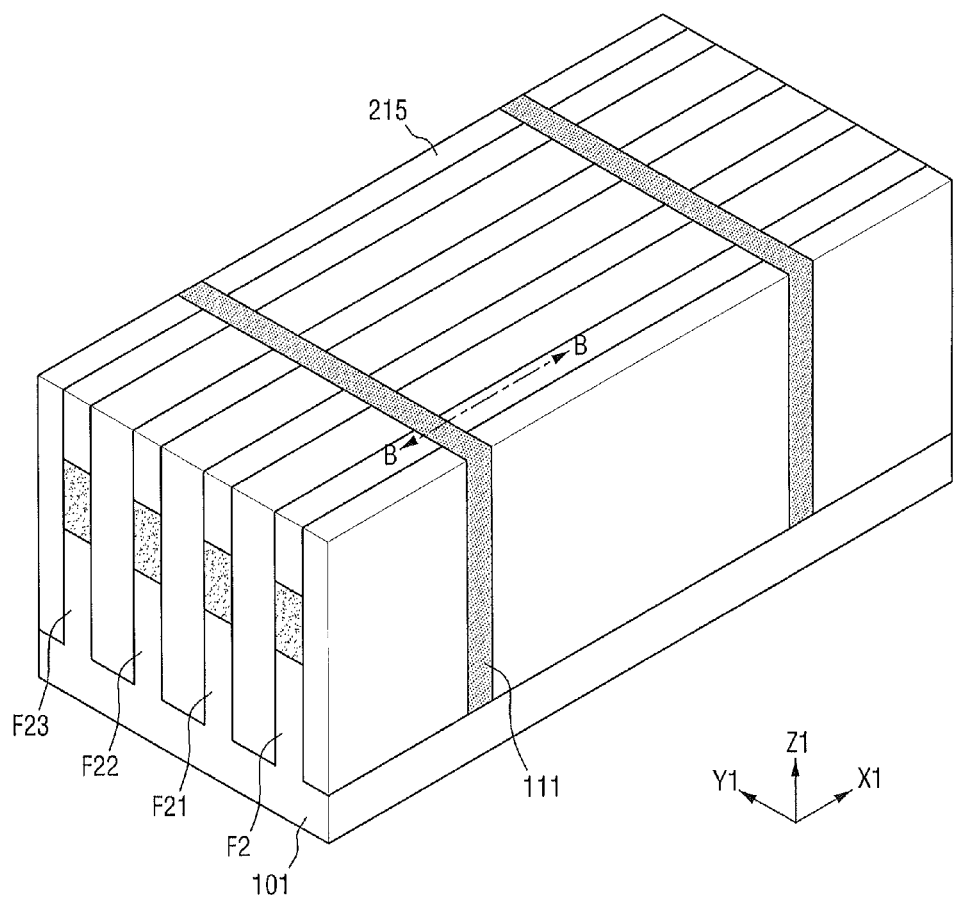
Figure 43:
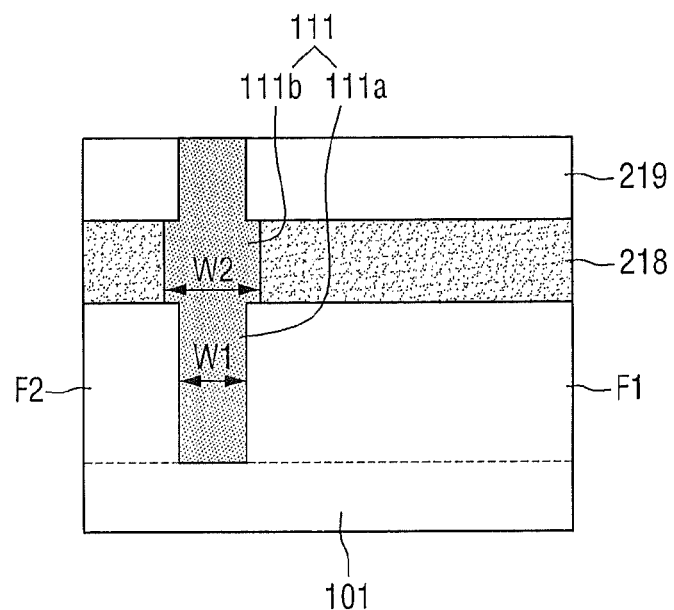

Referring to FIGS. 42 and 43, a first field insulating layer 111 is formed, the first field insulating layer 111 filling the trenches T1 and T2 and covering the exposed top surfaces of the fins F1 to F13, F2 to F23 and F3 to F33. The first field insulating layer 111 may be an oxide layer. In addition, the first field insulating layer 111 may be made of the same material with the second field insulating layer 115, but aspects of the present inventive concept are not limited thereto.

The first field insulating layer 111 may include a first region 111a between fins (e.g., F1 and F2) and a second region 111b hard mask layers 218 (i.e., nitride layers). A width W2 of the second region 111b may be greater than a width W1 of the first region 111a. As described above, as the result of performing the isotropic etching, the distance r1 increased toward the first fin F1 and the distance r2 increased toward the second fin F2 are equal to each other. Thus, an overlap length of the second region 111b of the first field insulating layer 111 and the first fin F1 and an overlap length of the second region 111b and the second fin F2 may be equal to each other.

Figure 44:
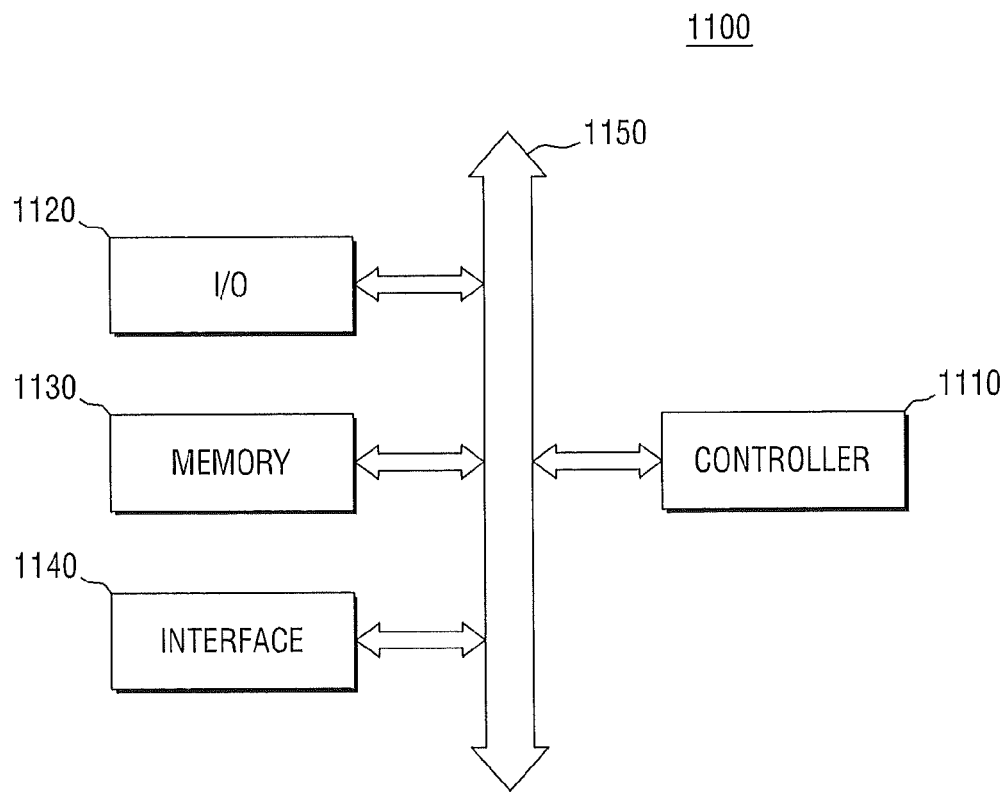
FIG. 44 is a block diagram of an electronic system including a semiconductor device according to some embodiments of the present inventive concept.

FIG. 44 is a block diagram of an electronic system including a semiconductor device according to some embodiments of the present inventive concept. Referring to FIG. 44, the electronic system 1100 may include a controller 1110, an input/output device (I/O) 1120, a memory 1130, an interface 1140 and a bus 1150. The controller 1110, the I/O 1120, the memory 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements.

The I/O 1120 may include a keypad, a keyboard, a display device, and so on. The memory 1130 may store data and/or codes. The interface 1140 may perform functions of transmitting data to a communication network or receiving data from the communication network. The interface 1140 may be a wired or a wireless interface. For example, the interface 1140 may include an antenna or a wired/wireless transceiver, and so on. The electronic system 1100 may further include high-speed DRAM and/or SRAM as the operating memory for improving the operation of the controller 1110. Fin type FETs according to embodiments of the present inventive concept may be incorporated into the memory 1130, or the I/O 1120 or other portions.

The electronic system 1100 may be used in a personal digital assistant (PDA), a portable computer, a web tablet, a wireless phone, a mobile phone, a digital music player, a memory card, or any type of electronic device capable of transmitting and/or receiving information in a wireless environment.

Figure 45:
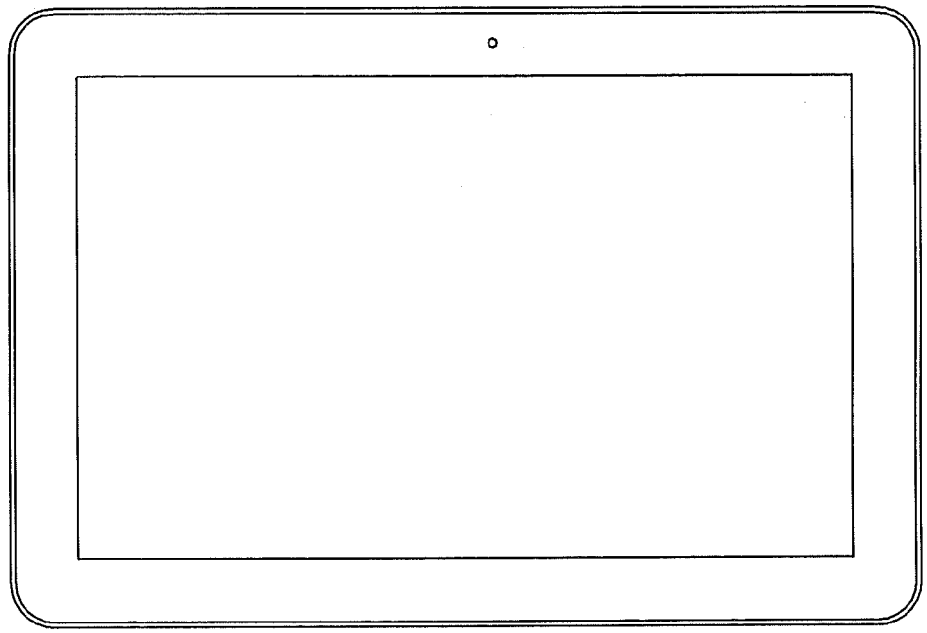
FIGS. 45 and 46 illustrate an exemplary semiconductor system in which semiconductor devices according to some embodiments of the present inventive concept can be included.
Figure 46:
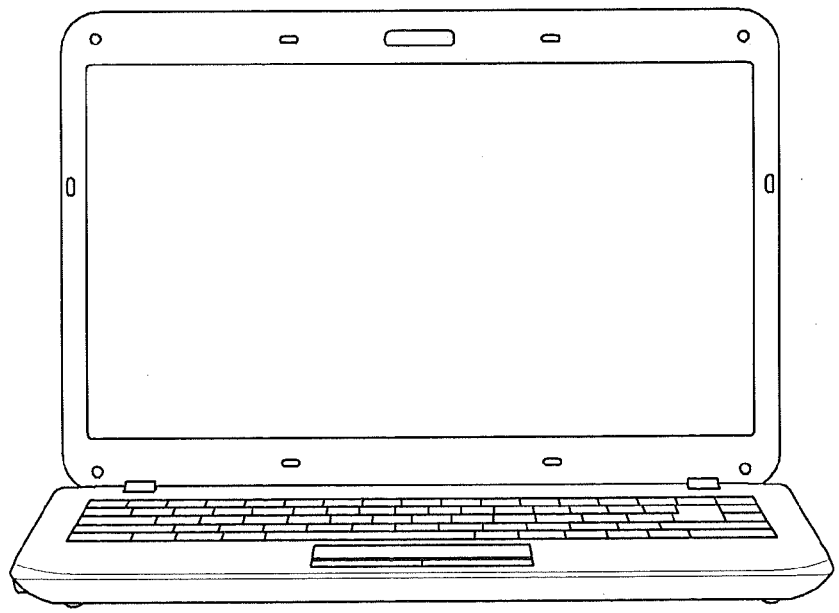

FIGS. 45 and 46 illustrate an exemplary semiconductor system to which semiconductor devices according to some embodiments of the present inventive concept can be employed.

FIG. 45 illustrates an example in which a semiconductor device according to an embodiment of the present inventive concept is applied to a tablet PC, and FIG. 46 illustrates an example in which a semiconductor device according to an embodiment of the present inventive concept is applied to a notebook computer. At least one of the semiconductor devices according to some embodiments of the present inventive concept can be employed to a tablet PC, a notebook computer, and the like. Semiconductor devices according to some embodiments of the present inventive concept may also be applied to other IC devices not illustrated herein.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed:

1. A method of forming a semiconductor structure comprising:
   forming a photolithography mask on a silicon fin having a hard mask layer thereon extending in a first direction;
   forming a trench through the hard mask layer into the silicon fin using the photolithography mask, the trench extending in a second direction to separate the silicon fin into first and second fin structures extending end-to-end in the first direction; and then
   widening a portion of the trench formed by the hard mask layer relative to a lower portion of the trench defined by the first and second fin structures.

2. The method of claim 1 wherein forming a photolithography mask is preceded by:
   forming the silicon fin;
   forming a lower field insulating layer adjacent to the silicon fin; and
   forming the hard mask layer on the silicon fin and on the lower field insulating layer.

3. The method of claim 2 wherein the lower field insulating layer and the hard mask layer comprise respective materials having an etch selectivity relative to one another.

4. The method of claim 2 wherein:
   forming a trench through the hard mask layer comprises etching through the hard mask layer to expose ends of the first and second fin structures separated by the trench; and
   widening a portion of the trench comprises widening the portion of the trench above the exposed ends to expose end corners of the first and second fin structures.

5. The method of claim 4 wherein widening a portion of the trench comprises isotropic etching of the hard mask layer in the trench.

6. The method of claim 5 wherein isotropic etching of the hard mask layer in the trench comprises recessing side walls of the hard mask layer equal amounts in opposing directions to widen the portion of the trench.

7. The method of claim 4 further comprising:
depositing an upper field insulating material into the trench through the hard mask layer to cover and conform to the end corners of the first and second fin structures.

8. The method of claim 7 further comprising:
removing the hard mask layer from the first and second fin structures to expose an upper surface of the lower field insulating layer;
etching upper surfaces of the lower field insulating layer and of the upper field insulating material to reduce respective thicknesses thereof so that the upper field insulating material remains conforming to the end corners of the first and second fin structures; and
forming a conductive layer on the upper surface of the upper field insulating material.

9. The method of claim 8 wherein etching the upper surfaces comprises etching equal amounts of the lower field insulating layer and the upper field insulating material so that the upper surface of the upper field insulating material remains to cover uppermost surfaces of the first and second fin structures.

10. The method of claim 8 wherein etching the upper surfaces comprises etching the lower field insulating layer and the upper field insulating material to reduce respective thicknesses thereof so that the upper surface of the upper field insulating material exposes uppermost surfaces of the first and second fin structures.

11. The method of claim 8 wherein forming a conductive layer comprises forming a gate-last dummy gate.

12. The method of claim 7 further comprising:
forming first and second epitaxial source/drain regions in the first and second fin structures, respectively, wherein uppermost surfaces of the first and second epitaxial source/drain regions are above an uppermost surface of the upper field insulating material.

13. The method of claim 7 further comprising:
forming first and second epitaxial source/drain regions in the first and second fin structures, respectively, wherein uppermost surfaces of the first and second epitaxial source/drain regions are coplanar with an uppermost surface of the upper field insulating material.

14. The method of claim 1 wherein forming a photolithography mask is preceded by:
forming a silicon layer;
forming a hard mask material on the silicon layer; and
etching the hard mask material and the silicon layer to form the silicon fin having the hard mask layer thereon.

15. The method of claim 14 further comprising:
forming a trench through the hard mask layer comprises etching through the hard mask layer to form the trench exposing the hard mask layer therein and to expose ends of the first and second fin structures separated by the trench;
widening a portion of the trench comprises widening the portion of the trench provided by the exposed hard mask layer in the trench to expose end corners of the first and second fin structures.

16. The method of claim 15 wherein widening a portion of the trench comprises isotropic etching of the hard mask layer in the trench.

17. The method of claim 16 wherein isotropic etching of the hard mask layer in the trench comprises recessing side walls of the hard mask layer equal amounts in opposing directions to widen the portion of the trench.

18. The method of claim 14 further comprising:
depositing a field insulating material in the trench conformal with the end corners of the first and second fin structures.

19. The method of claim 18 further comprising:
removing the hard mask layer from the first and second fin structures to expose an upper surface of the field insulating layer; and
forming a conductive layer on an upper surface of the field insulating material.

20. The method of claim 19 wherein forming a conductive layer comprises forming a gate-last dummy gate.

21. The method of claim 18 further comprising:
forming first and second epitaxial source/drain regions in the first and second fin structures, respectively, wherein uppermost surfaces of the first and second epitaxial source/drain regions are above an uppermost surface of the field insulating material.

22. The method of claim 18 further comprising:
forming first and second epitaxial source/drain regions in the first and second fin structures, respectively, wherein uppermost surfaces of the first and second epitaxial source/drain regions are coplanar with an uppermost surface of the field insulating material.

23. The method of claim 19 further comprising:
forming a lower field insulating layer adjacent to the silicon fin in the first direction.

24. The method of claim 1 wherein forming a photolithography mask on a silicon fin comprises forming the photolithography mask on a finFET silicon fin.

25. A method of forming a semiconductor structure comprising:
forming a field insulating layer including a protruding portion that protrudes from a trench to conform to end corners of first and second separated fins, to form a tuck structure that overlaps the end corners of the first and second separated fin structures;
forming a finFET on the first fin structure; and
forming a conductive layer extending from an uppermost surface of the protruding portion to cross over the protruding portion between the first and second fin structures.

26. The method of claim 25 wherein forming a conductive layer comprises forming a gate-last dummy gate.

27. A semiconductor device comprising:
first and second fin structures directly adjacent to one another and separated by a trench, wherein the first and second fin structures include respective first and second end corners forming an opening of the trench;
a field insulating layer including a protruding portion that protrudes from the trench to conform to the end corners of the first and second fin structures to form a tuck structure that overlaps the first and second fin structures;
a finFET on the first fin structure;
a conductive layer extending from an uppermost surface of the protruding portion to cross over the protruding portion between the first and second fin structures; and
a source/drain region in the first fin structure.

28. The device of claim 27 further comprising:
a conductive layer side wall spacer on the conductive layer including an outermost edge that is recessed from an outermost edge of the tuck structure.

29. The device of claim 27 wherein the source/drain region comprises an epitaxial source/drain region contacting an outermost edge of the tuck structure.

\* \* \* \* \*